(12) United States Patent
Ozasa et al.

(10) Patent No.: US 7,362,142 B2
(45) Date of Patent: Apr. 22, 2008

(54) CURRENT SOURCE APPARATUS, LIGHT-EMITTING-DEVICE APPARATUS AND DIGITAL-ANALOG CONVERTING APPARATUS

(75) Inventors: Masayuki Ozasa, Kyoto (JP); Manabu Ohkubo, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 64 days.

(21) Appl. No.: 11/003,399

(22) Filed: Dec. 6, 2004

(65) Prior Publication Data

US 2005/0127988 A1    Jun. 16, 2005

(30) Foreign Application Priority Data

Dec. 11, 2003    (JP) .............................. 2003-412718

(51) Int. Cl.
    *H03K 5/22*    (2006.01)
(52) U.S. Cl. ......................................... 327/66; 327/543
(58) Field of Classification Search .................. 327/53, 327/66, 514, 541, 543; 323/315; 345/82; 372/38.02
    See application file for complete search history.

(56) References Cited

U.S. PATENT DOCUMENTS

| | | | | |
|---|---|---|---|---|
| 5,179,301 A * | 1/1993 | Hughes | ...................... | 327/335 |
| 5,796,767 A * | 8/1998 | Aizawa | .................... | 372/38.02 |
| 5,835,994 A * | 11/1998 | Adams | ....................... | 323/315 |
| 6,160,436 A * | 12/2000 | Runaldue | .................... | 327/407 |
| 6,194,955 B1 * | 2/2001 | Ishida | ......................... | 327/538 |
| 6,236,252 B1 * | 5/2001 | Genest et al. | ................ | 327/178 |
| 6,466,080 B2 * | 10/2002 | Kawai et al. | ................ | 327/538 |
| 6,657,481 B2 * | 12/2003 | Rasmussen et al. | ........ | 327/540 |
| 6,831,498 B2 * | 12/2004 | Marsh | ........................ | 327/530 |
| 6,980,181 B2 * | 12/2005 | Sudo | ........................... | 345/82 |
| 7,064,696 B2 * | 6/2006 | Ohkubo et al. | ............. | 341/136 |
| 2004/0195981 A1 | 10/2004 | Mizuno et al. | ............. | 315/291 |

FOREIGN PATENT DOCUMENTS

| | | |
|---|---|---|
| JP | 11251912 | 9/1999 |
| JP | 2000-216486 | 8/2000 |
| JP | 2003-188465 | 7/2003 |
| JP | 2003188465 | 7/2003 |
| JP | 2003-338744 | 11/2003 |

OTHER PUBLICATIONS

T. Tamai, et al., ISBN 4-8222-7045-9, 3 pages total with English translation, 1990.
Japanese Office Action dated Oct. 30, 2007 with English Translation thereof.

* cited by examiner

*Primary Examiner*—Kenneth B. Wells
*Assistant Examiner*—Hai L. Nguyen
(74) *Attorney, Agent, or Firm*—Stevens, Davis, Miller & Mosher, LLP

(57) ABSTRACT

A current source apparatus includes a first MOS transistor having a drain serving as current input terminals with the gate connected to the drain, a first switch connected to the source of the first MOS transistor, a second MOS transistor having a drain serving as a current output terminal, a second switch connected to the source of the second MOS transistor, a third switch having one end connected to the gate of the first MOS transistor, and the other end connected to the gate of the second MOS transistor, and a drive circuit which controls the second switch and the third switch.

25 Claims, 36 Drawing Sheets

CURRENT SOURCE APPARATUS, LIGHT-EMITTING-DEVICE APPARATUS AND DIGITAL-ANALOG CONVERTING APPARATUS

BACKGROUND OF THE INVENTION

1. Field of the Invention

The present invention relates to a current source apparatus, a light-emitting-device drive apparatus and a digital-analog converting apparatus, which are used in electronic devices and integrated circuits.

2. Description of the Prior Art

A current source apparatus for use in an electronic device and an integrated circuit, which has a current mirror structure, is disclosed as first prior art in "Semiconductor Circuit Design Technology" (Nikkei BP Inc., first edition, sixth printing, p. 302-303).

FIG. 28 shows a circuit diagram of the current source apparatus according to the first prior art. In FIG. 28, symbols "M1" and "M2" denote MOS transistors constituting a current mirror. A symbol "CM1" denotes the input-side circuit of the current mirror. A symbol "CM2" denotes the output-side circuit of the current mirror. A symbol "1" denotes a supply-voltage application terminal through which a supply voltage is applied to the input-side circuit CM1 and the output-side circuit CM2 of the current mirror. A symbol "2" denotes the current input terminal of the input-side circuit CM1 of the current mirror. A symbol "3" denotes the output terminal of the input-side circuit CM1 of the current mirror. A symbol "4" denotes the input terminal of the output-side circuit CM2 of the current mirror. The input terminal 4 of the current mirror output-side circuit CM2 is connected to the output terminal 3 of the current mirror input-side circuit CM1. A symbol "5" denotes the current output terminal of the current mirror output-side circuit CM2. A symbol "6" denotes a control-signal input terminal to which a signal for current interruption control is input. A symbol "CS" denotes a current source connected between the current input terminal 2 of the current mirror input-side circuit CM1 and the ground. A symbol "Iin" denotes the current that flows in the current source CS. A symbol "SW4" denotes a switch inserted between the MOS transistor M1 and the current input terminal 2. A symbol "INV1" denotes an inverter logic circuit connected between the control-signal input terminal 6 and a control terminal of the switch SW4. A symbol "LD" denotes a load connected between the current output terminal 5 of the current mirror output-side circuit CM2 and the ground. A symbol "Iout" denotes the current that flows across the load LD.

In the current source apparatus, the MOS transistors M1 and M2 constitute the current mirror, and the inverter logic circuit INV1 works on the switch SW4 according to the control terminal input signal to be applied to the control-signal input terminal 6. When the switch SW4 is ON, the input current Iin is input to the MOS transistor M1. As a result, the current is inverted by the current mirror, so that the output current Iout is output to the load LD. When the switch SW4 is OFF, the input current Iin is not input to the MOS transistor M1. Therefore, the output current Iout does not flow to the load LD from the current mirror (Iout=0).

A current source apparatus and a digital-analog converting apparatus for use in an electronic device and an integrated circuit are disclosed as second prior art in Japanese Patent Laid-Open Publication No. H11-251912 (page 7 and FIG. 1).

FIG. 31 shows a circuit diagram of the current source apparatus according to the second prior art. In FIG. 31, a symbol "SW5" denotes a switch connected between the common source and the common gate of the MOS transistors M1 and M2. The switch SW5 is used in place of the switch SW4 in FIG. 28. The other structure is the same as that of the current source apparatus in FIG. 28.

In the current source apparatus, the MOS transistors M1 and M2 constitute the current mirror, and the inverter logic circuit INV1 works on the switch SW5 according to the control terminal input signal to be applied to the control-signal input terminal 6. When the switch SW5 is OFF, the input current Iin is input to the MOS transistor M1. As a result, the current is inverted by the current mirror, so that the output current Iout is output to the load LD. When the switch SW5 is ON, the input current Iin flows through the switch SW5 and does not flow into the MOS transistor M1. Therefore, the output current Iout is not supplied to the load LD from the MOS transistor M2.

Another current source apparatus and a light-emitting-device drive apparatus, which have been conventionally used in an electronic device and an integrated circuit, are disclosed as third prior art in Japanese Patent Laid-Open Publication No. 2003-188465 (page 10 and FIG. 1).

FIG. 34 shows a circuit diagram of the current source apparatus according to the third prior art. In FIG. 34, a symbol "INV3" denotes an inverter logic circuit. A symbol "C2" denotes a capacitor. This current source apparatus differs from the current source apparatus in FIG. 28 in the addition of the inverter logic circuit INV3 and the capacitor C2. The other structure is the same as that of the current source apparatus in FIG. 28.

In the current source apparatus, the MOS transistors M1 and M2 constitute the current mirror, and the inverter logic circuit INV1 works on the switch SW4 according to the control terminal input signal to be applied to the control-signal input terminal 6. When the switch SW4 is ON, the input current Iin is input to the MOS transistor M1. As a result, the current is inverted by the current mirror, so that the output current Iout is output to the load LD. Further, the output of the inverter logic circuit INV3 is added to the output current Iout via the capacitor C2. When the switch SW4 is OFF, the input current Iin does not flow into the MOS transistor M1. Therefore, the output current Iout is not supplied to the load LD from the MOS transistor M2. Further, the output of the inverter logic circuit INV3 positively turns the MOS transistor M1 off via the capacitor C2.

The conventional digital-analog converting apparatus for use in an electronic device is demanded of being able to operate fast and linearly changing the amount of the output current when it is in operation.

At the time of emitting light, the conventional light emitting device to be used in an electronic device is demanded of being able to switch between the light-ON state and the light-OFF state at a high speed and linearly changing the amount of light emission.

At the time of driving a light emitting device, the conventional current source apparatus and light-emitting-device drive apparatus, which are used in such a light emitting device, are demanded of being able to can interrupt the output current at a high speed, and linearly changing the amount of the current.

At the time of driving a load, the conventional current source apparatus to be used in a digital-analog converting apparatus is demanded of being able to interrupt the output current at a high speed, and linearly changing the amount of the current.

With the current source apparatus as shown in FIG. 28 in use, for example, even when the switch SW4 is turned off, the charges charged in the gate capacitors of the MOS transistors M1 and M2 cannot be pulled out. When the switch SW4 is turned off, therefore, the load current cannot be interrupted immediately. The load current thus has a held waveform as shown in FIG. 29, which shows the waveforms of the control terminal input signal to be applied to the control-signal input terminal 6 and the load current flowing across the load LD. Accordingly, the current source apparatus cannot interrupt the current at a high speed. In addition, the linearity of the output current is lost in a high-speed operation, as shown in FIG. 30, which shows the relationship between the input current Iin and an output current effective value or an output current root-mean-square value Ioutrms for the target value, a low-speed mode and a high-speed mode. It is apparent that a light-emitting-device drive apparatus constructed by using the current source apparatus does not become an adequate light-emitting-device drive apparatus. The current source apparatus, when used in a digital-analog converting apparatus, causes an error in converted output.

With a current source apparatus shown in FIG. 31 in use, for example, even when the switch SW5 is turned off, it takes time to charge the gate capacitors of the MOS transistors M1 and M2 thereafter, so that the current cannot rise soon. Therefore, the load current would have a waveform with a slow rise as shown in FIG. 32, which shows the waveforms of the control terminal input signal to be applied to the control-signal input terminal 6 and the load current flowing across the load LD. Accordingly, the current source apparatus cannot interrupt the current at a high speed. In addition, the linearity of the output current is lost in a high-speed operation, as shown in FIG. 33, which shows the relationship between the input current Iin and the output current root-mean-square value Ioutrms for the target value, a low-speed mode and a high-speed mode. It is apparent that a light-emitting-device drive apparatus constructed by using the current source apparatus does not become an adequate light-emitting-device drive apparatus. The current source apparatus, when used in a digital-analog converting apparatus, causes an error in converted output.

With the current source apparatus as shown in FIG. 34 in use, for example, the load LD is driven by the ON/OFF action of the switch SW4 and via a capacitor C2. The time and the current amount that are compensated for by the capacitor C2 are determined by the capacitance C2, the gate capacitances of the MOS transistors M1 and M2, and the source resistance of the MOS transistor M1. Therefore, the amount of the load current cannot be controlled by the current interruption by the switch SW4. The load current would therefore have a waveform in which an uncontrollable current amount is added to the proper current amount, as shown in FIG. 35 which shows the waveforms of the control terminal input signal to be applied to the control-signal input terminal 6 and the load current flowing across the load LD. What is more, the linearity of the output current is lost in a high-speed operation, as shown in FIG. 36, which shows the relationship between the input current Iin and the output current root-mean-square value Ioutrms for the target value, a low-speed mode and a high-speed mode. It is apparent that a light-emitting-device drive apparatus constructed by using the current source apparatus does not become an adequate light-emitting-device drive apparatus. The current source apparatus, when used in a digital-analog converting apparatus, causes an error in converted output.

SUMMARY OF THE INVENTION

Accordingly, it is the first object of the present invention to provide a current source apparatus capable of interrupting the output current at a high speed and linearly changing the current amount.

It is the second object of the present invention to provide a light-emitting-device drive apparatus capable of switching between the light-ON state and the light-OFF state of a light emitting device at a high speed and linearly changing the amount of light emission.

It is the third object of the present invention to provide a digital-analog converting apparatus capable of interrupting the output current at a high speed and linearly changing the current amount.

To achieve the objects, a current source apparatus according to one aspect of the invention includes a first MOS transistor having a drain serving as a current input terminal and a gate connected to the drain; a second MOS transistor having a drain serving as a current output terminal; a first switch connected to a source of the second MOS transistor; a second switch having one end connected to the gate of the first MOS transistor and an other end connected to a gate of the second MOS transistor; and a drive circuit which controls the first switch and the second switch.

With the structure, the first switch is provided at the source of the second MOS transistor, the second switch is provided between the gate of the first MOS transistor and the gate of the second MOS transistor, the current in the second MOS transistor is directly interrupted by the first switch, and the current path between the gate of the first MOS transistor and the gate of the second MOS transistor is released when the second MOS transistor is turned off by the OFF action of the first switch. This can allow the second MOS transistor to be turned off fast. In addition, with the second MOS transistor being OFF, the charges stored in the gate capacitor of the second MOS transistor can be held. This makes it possible to eliminate the need for charging the gate capacitor of the second MOS transistor when the second MOS transistor is turned on again. Consequently, the second MOS transistor can be turned on immediately. It is therefore possible to interrupt the current fast and linearly change the current amount.

It is preferable that in the current source apparatus, a buffer should be inserted in a path from the drain of the first MOS transistor to the gate thereof.

As the buffer is inserted in the path extending from the drain of the first MOS transistor to the gate thereof, the buffer can suppress the influence of a change in charges, caused by the excessive actions of the first and second switches, on the first MOS transistor. This can reduce an error in current level, thereby enhancing the linearity of the current.

It is preferable that the current source apparatus according should further comprise an emphasis circuit whose input is an output of the drive circuit and whose output is connected to the source of the second MOS transistor, and which emphasizes rising and falling of a drain current from the second MOS transistor.

According to the structure, the emphasis circuit emphasizes the rising and falling of the output current. This can ensure faster interruption of the output current, and can thus further improve the linearity of the output current.

In the current source apparatus, for example, the first switch is comprised of a third MOS transistor, the second switch is comprised of a fourth MOS transistor, and a fifth MOS transistor is connected to a source of the first MOS transistor.

In the current source apparatus, for example, the buffer is a source follower circuit which has an input portion connected to the drain of the first MOS transistor, and an output portion connected to the gate of the first MOS transistor.

A light-emitting-device drive apparatus according to the present invention has the above-described current source apparatus of the invention. The light-emitting-device drive apparatus includes a current mirror input-side circuit; and a plurality of current mirror output-side circuits whose input portions are commonly connected to an output portion of the current mirror input-side circuit and whose current output terminals are commonly connected to a light emitting device.

The current mirror input-side circuit is comprised of a first MOS transistor having a drain serving as a current input terminal and a gate connected to the drain. Each of the plurality of current mirror output-side circuits is comprised of a second MOS transistor having a drain serving as a current output terminal, a first switch connected to a source of the second MOS transistor, a second switch having one end connected to the gate of the first MOS transistor and an other end connected to a gate of the second MOS transistor, and a drive circuit which controls the first switch and the second switch.

Another light-emitting-device drive apparatus according to the present invention includes a first current mirror input-side circuit and a second current mirror input-side circuit of different current polarities; and first plural current mirror output-side circuit and second plural current mirror output-side circuit whose input portions are respectively connected to output portions of the first and second current mirror input-side circuits and whose current output terminals are commonly connected to a light emitting device.

The current mirror input-side circuit is comprised of a first MOS transistor having a drain serving as a current input terminal and a gate connected to the drain. Each of the first and second plural current mirror output-side circuits is comprised of a second MOS transistor having a drain serving as a current output terminal, a first switch connected to a source of the second MOS transistor, a second switch having one end connected to the gate of the first MOS transistor and an other end connected to a gate of the second MOS transistor, and a drive circuit which controls the first switch and the second switch.

This structure can achieve an excellent light-emitting-device drive apparatus capable of switching between the light-ON state and the light-OFF state of the light emitting device at a high speed to linearly change the amount of light emission.

A digital-analog converting apparatus according to the present invention has the above-described current source apparatus. The digital-analog converting apparatus includes a current mirror input-side circuit; and a plurality of current mirror output-side circuits whose input portions are commonly connected to an output portion of the current mirror input-side circuit and whose current output terminals are commonly connected.

The current mirror input-side circuit is comprised of a first MOS transistor having a drain serving as a current input terminal and a gate connected to the drain. Each of the plurality of current mirror output-side circuits is comprised of a second MOS transistor having a drain serving as a current output terminal, a first switch connected to a source of the second MOS transistor, a second switch having one end connected to the gate of the first MOS transistor and an other end connected to a gate of the second MOS transistor, and a drive circuit which controls the first switch and the second switch.

The plurality of current mirror output-side circuits is separated into groups of a number corresponding to a weight of each bit of an input digital value of a plurality of bits to be converted, whereby the first and second switches of the drive circuits of each group of current mirror output-side circuits are controlled according to data of the associated bit in the input digital value. Accordingly, a current corresponding to the input digital value is output as a combined output current of the plurality of current mirror output-side circuits.

This structure can achieve an excellent digital-analog converting apparatus capable of interrupting the output current at a high speed and linearly changing the current amount.

DETAILED DESCRIPTION OF THE PREFERRED EMBODIMENTS

The first embodiment of the present invention will now be described referring to the accompanying drawings.

Figure 1:
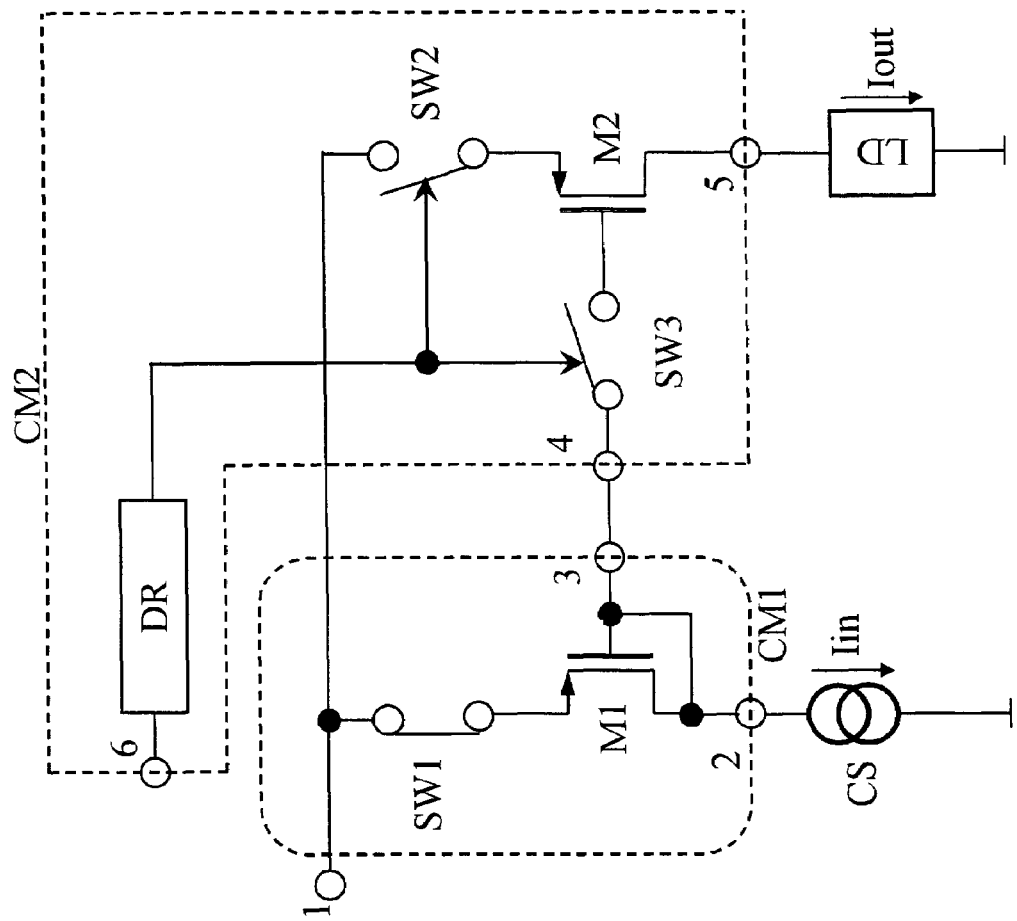
FIG. 1 is a circuit diagram illustrating the structure of a current source apparatus according to a first embodiment of the present invention.

FIG. 1 shows a circuit diagram of a current source apparatus according to the first embodiment. Referring to FIG. 1, a symbol "SW1" denotes a switch which is normally ON. A symbol "SW2" denotes a switch which interrupts the output current. A symbol "SW3" denotes a switch which reduces the influence of an input-side circuit CM1 of a current mirror on an output-side circuit CM2. A symbol "DR" denotes a drive circuit which drives the switches.

Figure 2:
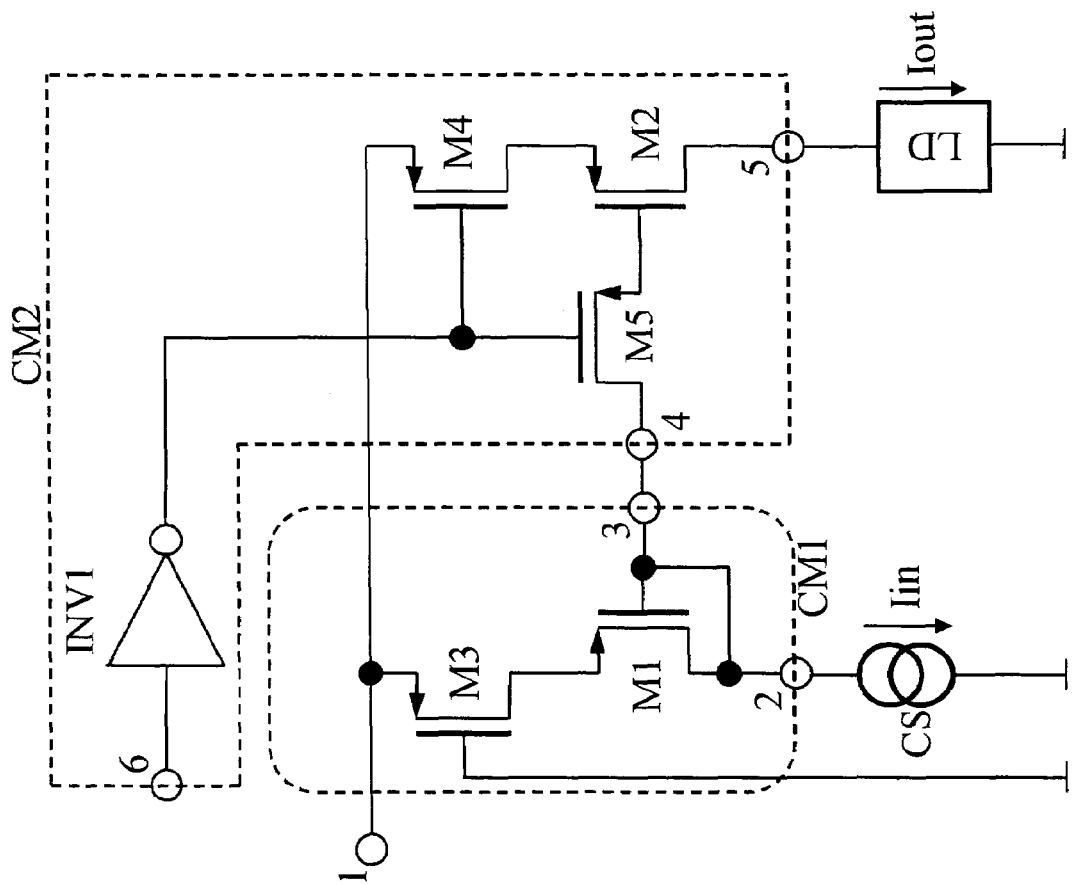
FIG. 2 is a circuit diagram illustrating a more specific structure of the current source apparatus according to the first embodiment of the present invention.

In FIG. 2 showing a more specific circuit, symbols "M3", "M4" and "M5" denote MOS transistors. The MOS transistor M1 and the MOS transistor M2 constitute a current mirror. A MOS transistor M3 constitutes the switch SW1, an MOS transistor M4 constitutes the switch SW2, and an MOS transistor M5 constitutes the switch SW3. Further, an inverter logic circuit INV1 constitutes the drive circuit DR.

The operation of the current source apparatus according to the first embodiment with the above-described structure will be discussed referring to FIG. 2. When the control terminal input signal to be applied to a control-signal input terminal 6 has a high level, the MOS transistor M4 and the MOS transistor M5 are turned on. At this time, a current Iout is output from the MOS transistor M2. The value of the output current is the value of the input current amplified by the ratio of the size of the MOS transistor M1 to the size of the MOS transistor M2 and the ratio of the size of the MOS transistor M3 to the size of the MOS transistor M4.

When the control terminal input signal to be applied to the control-signal input terminal 6 goes to a low level, the MOS transistor M4 is driven and turned off by the inverter logic circuit INV1. According to the switching speed, the current in the MOS transistor M2 is cut off, thus turning the MOS transistor M2 off. At the same time, the MOS transistor M5 is turned off, so that the charges held in the gate capacitor of the MOS transistor M2 are kept.

When the control terminal input signal to be applied to the control-signal input terminal 6 goes to a high level again, the MOS transistor M5 is turned on. As the charges are held in the gate capacitor of the MOS transistor M2 at this time, it is hardly necessary to drive the gate capacitor of the MOS transistor M2. Accordingly, the MOS transistor M2 is turned on according to the turn-ON speed of the MOS transistor M4, thus outputting the current Iout.

Figure 3:
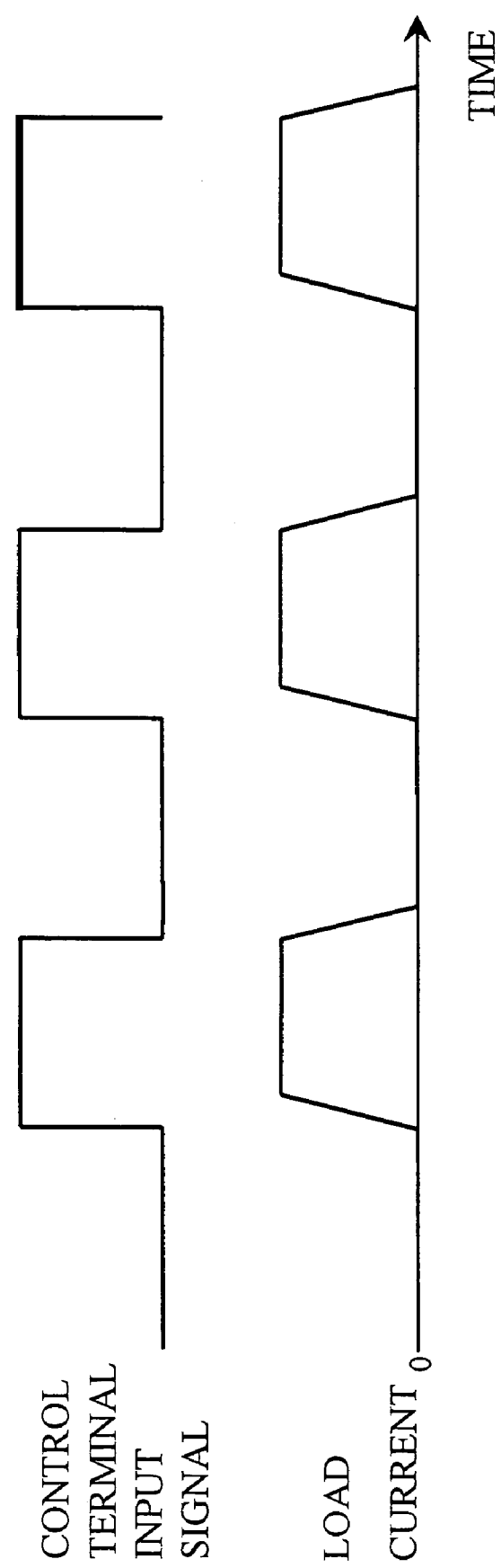
FIG. 3 is a waveform diagram for explaining the operation of the current source apparatus according to the first embodiment of the present invention.
Figure 4:
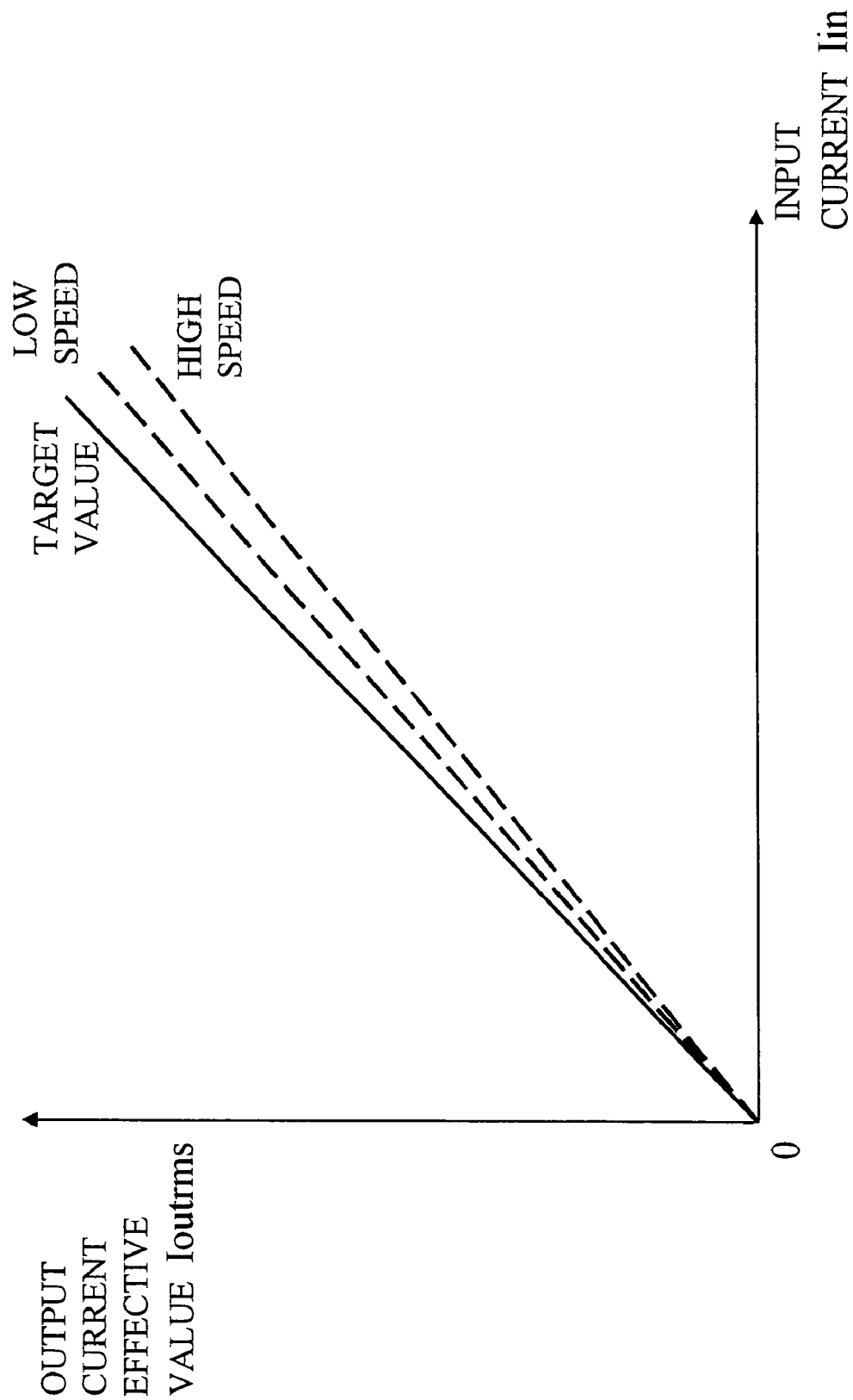
FIG. 4 is a characteristic diagram of the input current v.s. output current root-mean-square value for explaining the operation of the current source apparatus according to the first embodiment of the present invention.

The speed of the current interruption therefore almost accords to the ON/OFF speed of only the MOS transistor M4, thereby ensuring a very quick operation as shown in FIG. 3. FIG. 3 shows the waveforms of the control terminal input signal to be applied to the control-signal input terminal 6 and the load current flowing across a load LD. As the current rising and falling are fast, so that the linearity with respect to the input current is maintained as shown in FIG. 4. FIG. 4 shows the relationship between the input current Iin and the output current root-mean-square value Ioutrms for the target value, the low-speed mode and the high-speed mode.

According to the first embodiment, as apparent from the above, the switch SW2 is provided at the source of the MOS transistor M2, the switch SW3 is provided between the gate and drain of the MOS transistor M1 and the gate of the MOS transistor M2, the current in the MOS transistor M2 is directly interrupted by the switch SW2, and the current path between the gate and drain of the MOS transistor M1 and the gate of the MOS transistor M2 is released when the MOS transistor M2 is turned off by the OFF action of the switch SW2. This can allow the MOS transistor M2 to be turned off at a high speed, and can allow the charges stored in the gate capacitor of the MOS transistor M2 to be held when the MOS transistor M2 is OFF. This makes it unnecessary to charge the gate capacitor of the MOS transistor M2 when the MOS transistor M2 is turned on again. As a result, the MOS transistor M2 can be turned on immediately. This makes it possible to interrupt the current at a high speed and linearly change the current amount.

Figure 5:
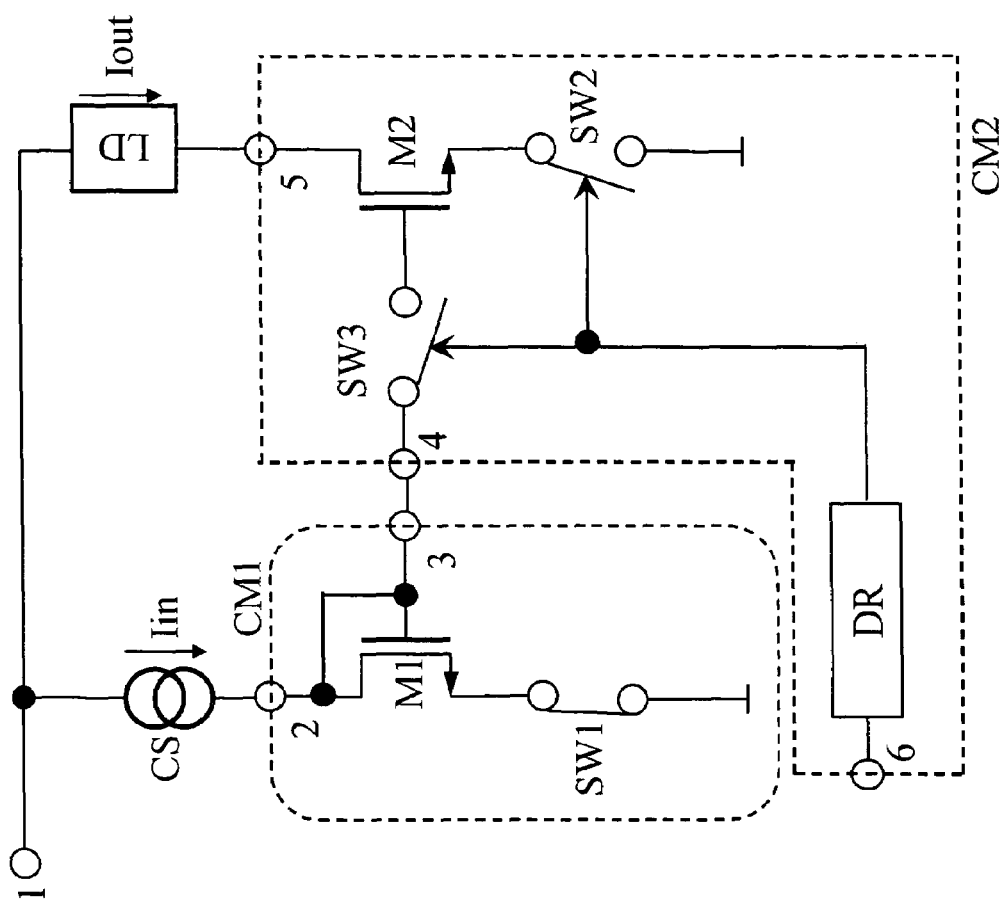
FIG. 5 is a circuit diagram illustrating the structure of a current source apparatus according to a second embodiment of the present invention.
Figure 6:
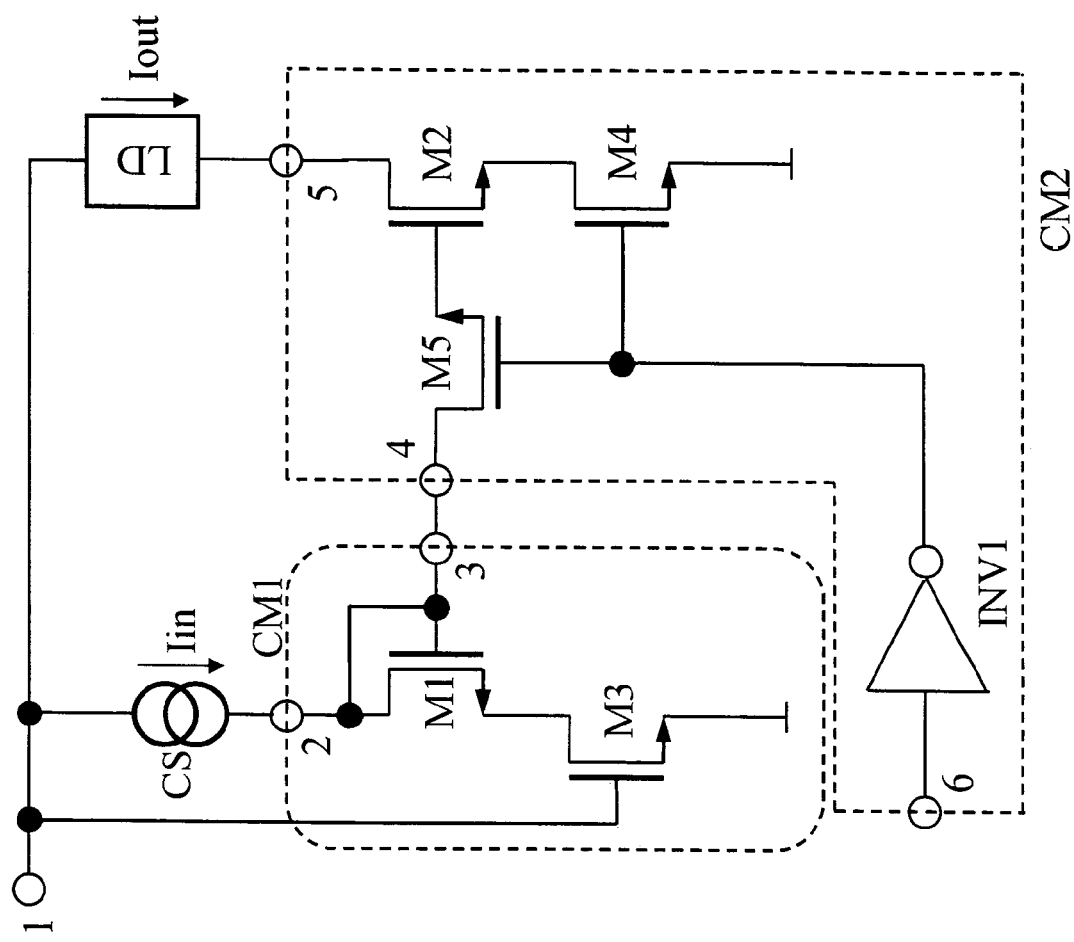
FIG. 6 is a circuit diagram illustrating a more specific structure of the current source apparatus according to the second embodiment of the present invention.

Although p-channel MOS transistors are used as the MOS transistors M1, M2, M3, M4 and M5 in the first embodiment, n-channel MOS transistors may be used as shown in FIGS. 5 and 6 (second embodiment).

Figure 7:
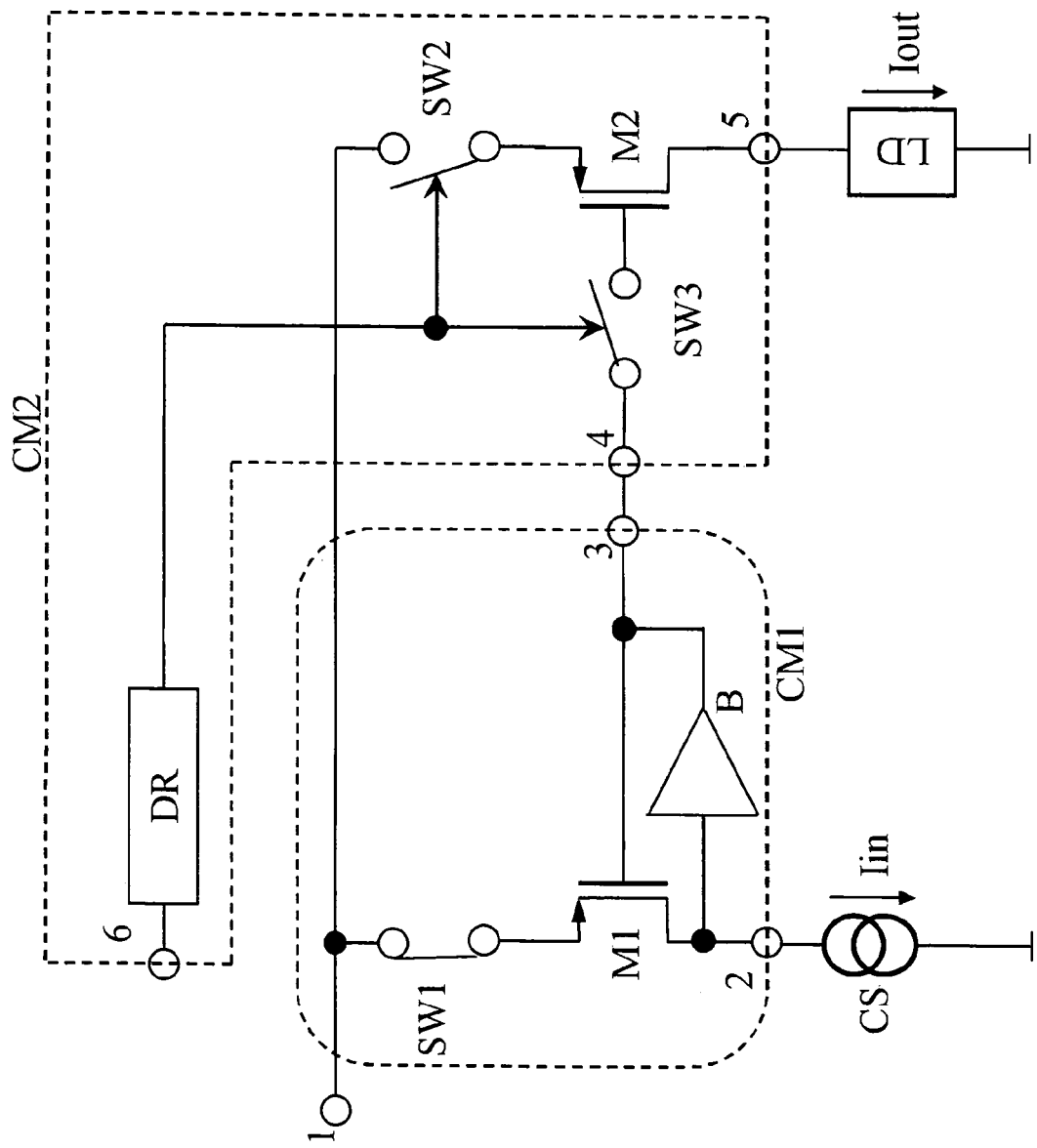
FIG. 7 is a circuit diagram illustrating the structure of a current source apparatus according to a third embodiment of the present invention.
Figure 8:
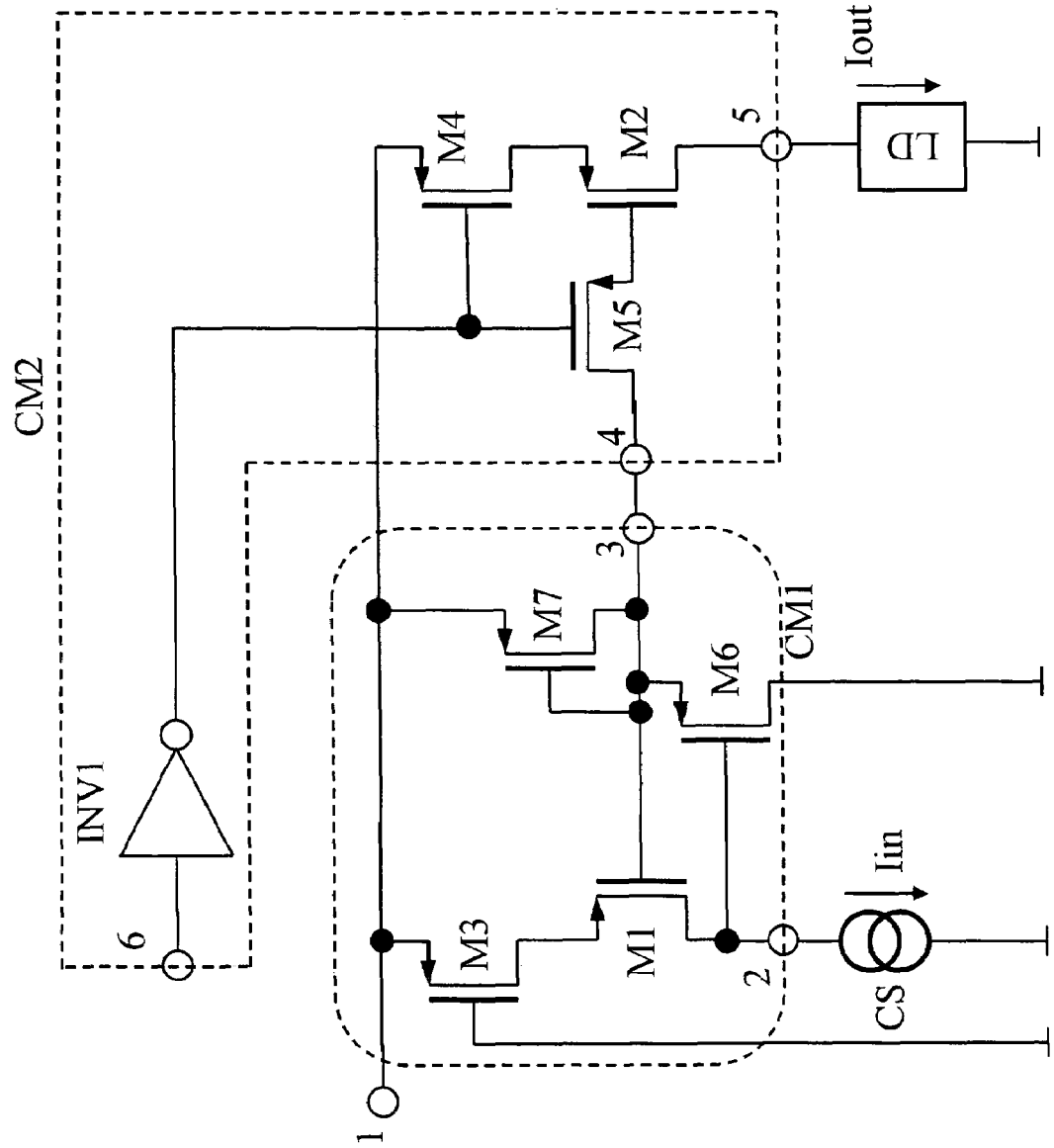
FIG. 8 is a circuit diagram illustrating a more specific structure of the current source apparatus according to the third embodiment of the present invention.

FIG. 7 shows a circuit diagram of a current source apparatus according to the third embodiment. In FIG. 7, a symbol "B" denotes a voltage buffer. In FIG. 8 which shows a more specific structure, symbols "M6" and "M7" denote MOS transistors. The MOS transistors M6 and M7 constitute a source follower circuit and operates as a buffer. The other structure is the same as that illustrated in FIGS. 1 and 2.

The operation of the current source apparatus according to the third embodiment with the above-described structure will be discussed referring to FIG. 8. The current source apparatus, which operates like that of the first embodiment, reduces the influence of a change in charges, caused by the excessive actions of the MOS transistors M4 and M5, on the MOS transistor M1 by means of the buffer. This can provide a current source apparatus with a higher linearity than the current source apparatus according to the first embodiment.

The following will specifically discuss the suppression of the influence of a change in charges, caused by the excessive actions of the MOS transistors M4 and M5, on the MOS transistor M1 by means of the buffer. An MOS transistor has a parasitic capacitor present between the gate and the source, and a parasitic capacitor present between the gate and the drain. When an MOS transistor is used as a switch, an excessive change in gate voltage flows as charges to the source and the drain through those capacitors (feed through). This becomes a current change which influences the amount of the current in the MOS transistor M1, causing a level error. The insertion of the buffer between the MOS transistor M1 and the MOS transistor M5 can suppress the current change.

As the buffer is provided in the path extending from the drain of the MOS transistor M1 to the gate thereof according to the third embodiment, the buffer can reduce the influence of a change in charges, caused by the excessive actions of the MOS transistors M4 and M5, on the MOS transistor M1. This can reduce an error in current level and improve the linearity of the current in addition to the advantages of the first embodiment.

Figure 9:
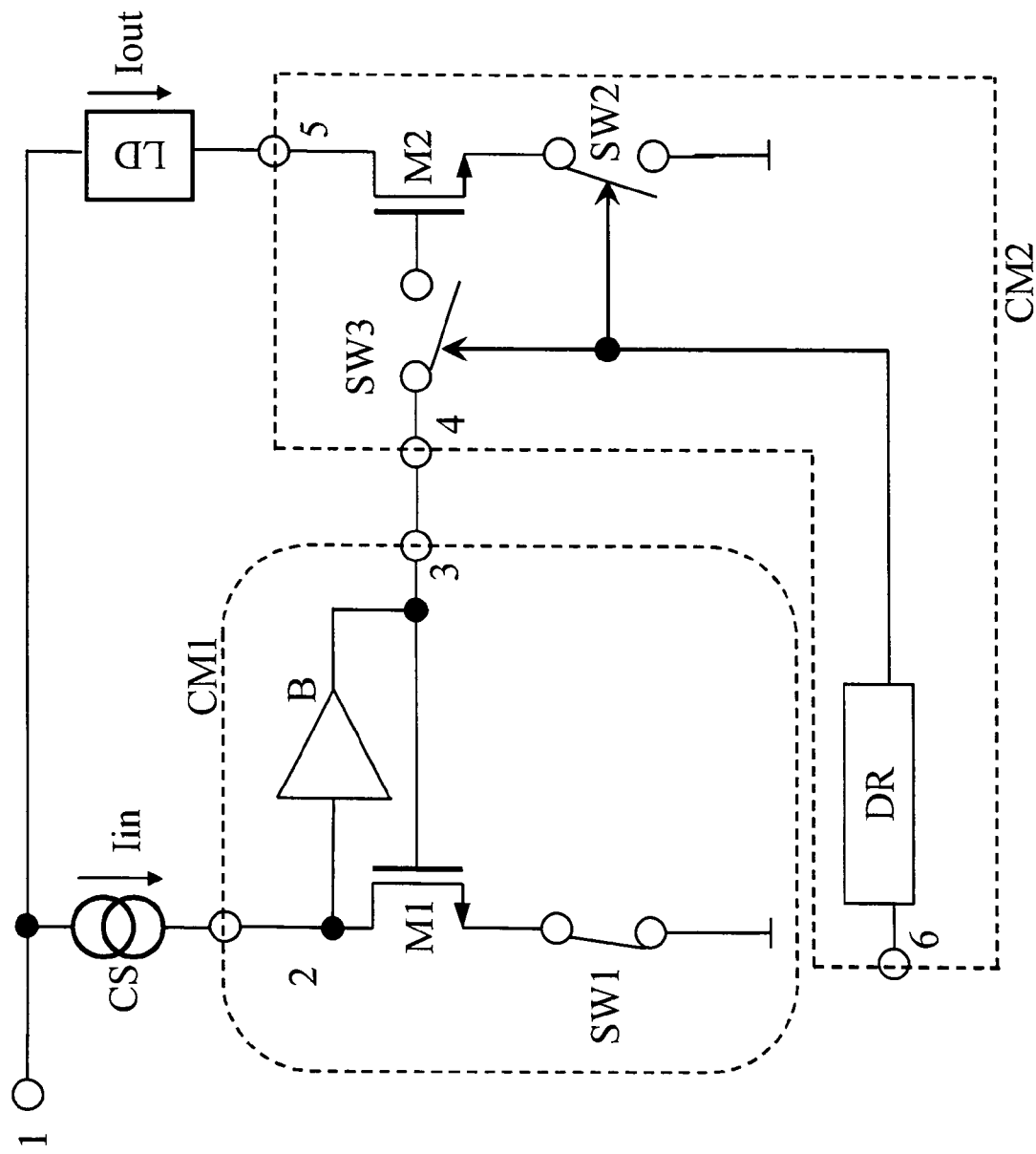
FIG. 9 is a circuit diagram illustrating the structure of a current source apparatus according to a fourth embodiment of the present invention.
Figure 10:
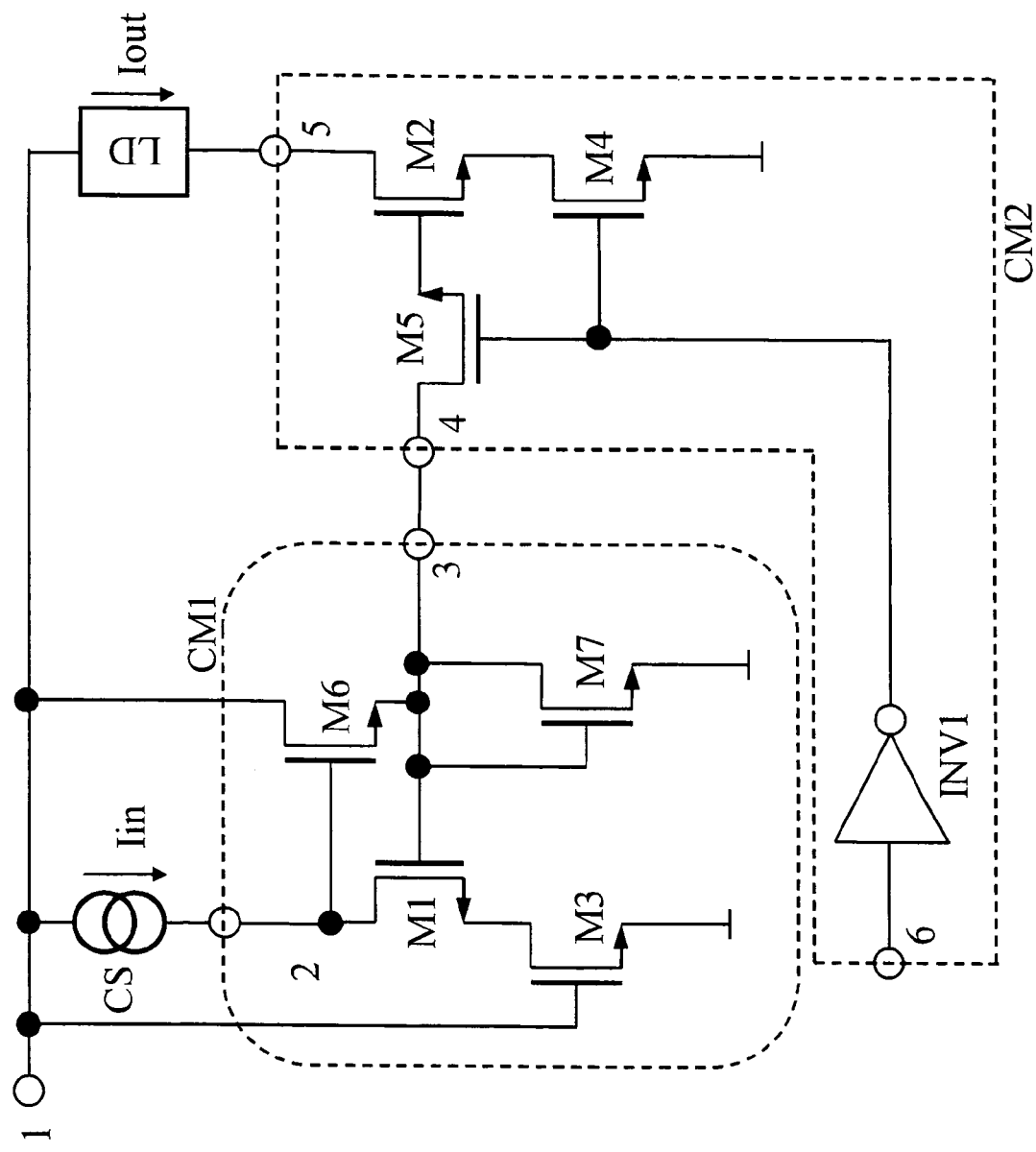
FIG. 10 is a circuit diagram illustrating a more specific structure of the current source apparatus according to the fourth embodiment of the present invention.

Although p-channel MOS transistors are used as the MOS transistors M1 to M7 in the third embodiment, n-channel MOS transistors may be used as shown in FIGS. 9 and 10 (fourth embodiment). While the MOS transistor M7 is used in diode connection in the source follower circuit, a current source can be used in place of the MOS transistor M7.

Figure 11:
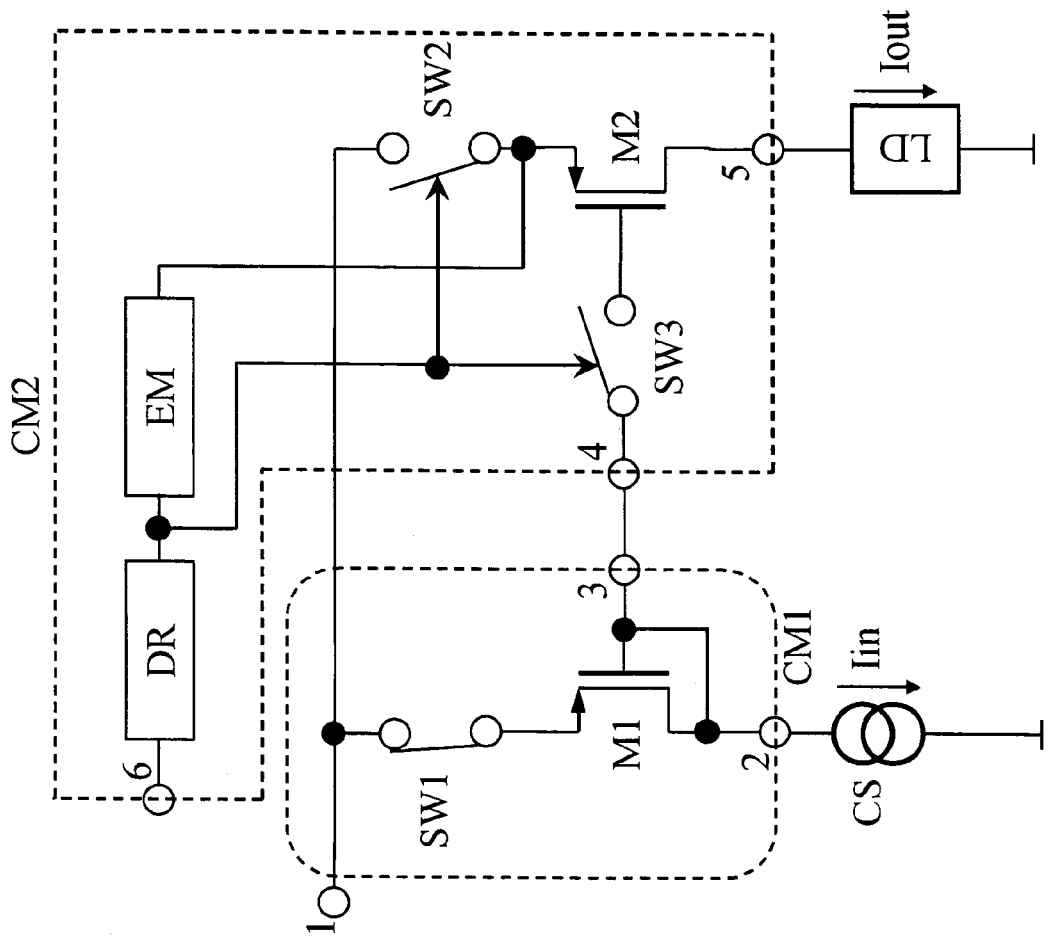
FIG. 11 is a circuit diagram illustrating the structure of a current source apparatus according to a fifth embodiment of the present invention.
Figure 12:
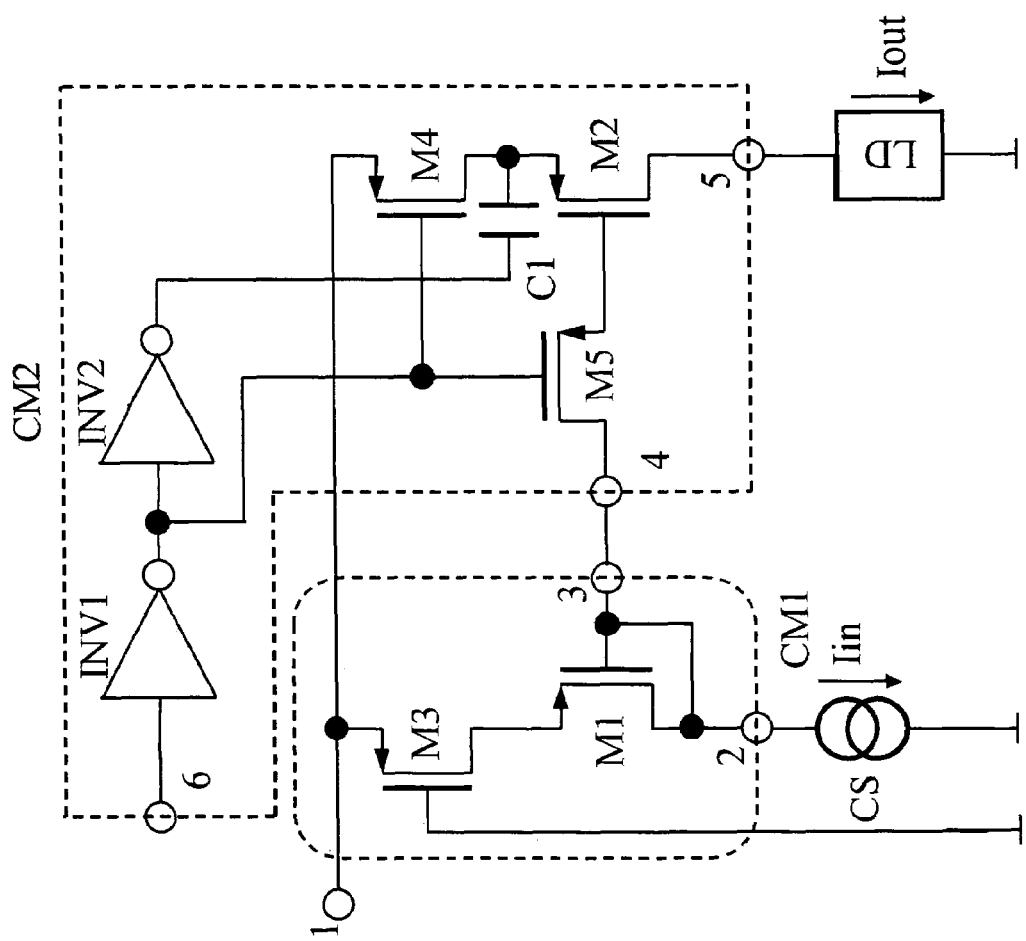
FIG. 12 is a circuit diagram illustrating a more specific structure of the current source apparatus according to the fifth embodiment of the present invention.

FIG. 11 shows a circuit diagram of a current source apparatus according to the fifth embodiment. In FIG. 11, a symbol "EM" denotes an emphasis circuit which emphasizes the rising and falling of the current Iout. In FIG. 12 which shows a more specific circuit, a symbol "C1" denotes a capacitor. A symbol "INV2" denotes an inverter logic circuit which drives the capacitor. The capacitor C1 and the inverter logic circuit INV2 constitute the emphasis circuit EM, and operates as a circuit to improve the rising and falling response of the current Iout.

Figure 13:
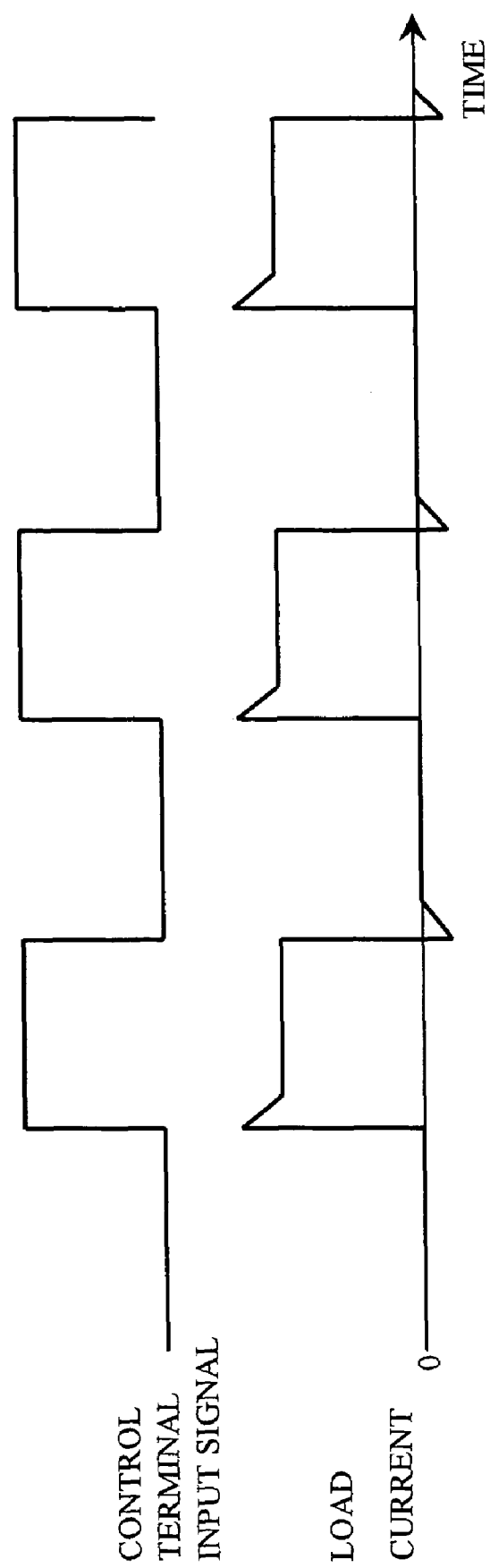
FIG. 13 is a waveform diagram for explaining the operations of the current source apparatuses according to the fifth and seventh embodiments of the present invention.

The operation of the current source apparatus according to the fifth embodiment with the above-described structure will be discussed referring to FIG. 12. The current source apparatus operates like current source apparatus in FIG. 2, except the capacitor C1 and the inverter logic circuit INV2, which constitute the emphasis circuit EM, and outputs the current Iout. The pulse from the inverter logic circuit INV2 drives the capacitor C1, the ON resistor of the MOS transistor M4 and the source of the MOS transistor M2. This allows the current of the differential component to be added to the current Iout via the MOS transistor M2 in the gate-grounded fashion. As the adequate selection of the constant of the capacitor C1 can pass only a high-frequency component, the rising part and the falling part of the current Iout are emphasized as shown in FIG. 13, thus ensuring faster rising and falling than achieved by the first embodiment. FIG. 13 shows the waveforms of the control terminal input signal to be applied to the control-signal input terminal 6 and the load current flowing across the load LD.

According to the fifth embodiment, as described above, the rising and falling of the current Iout are emphasized by the emphasis circuit. This can ensure faster interruption of the current Iout, thus further enhancing the linearity of the current Iout. The other advantages are the same as those of the first embodiment.

Figure 14:
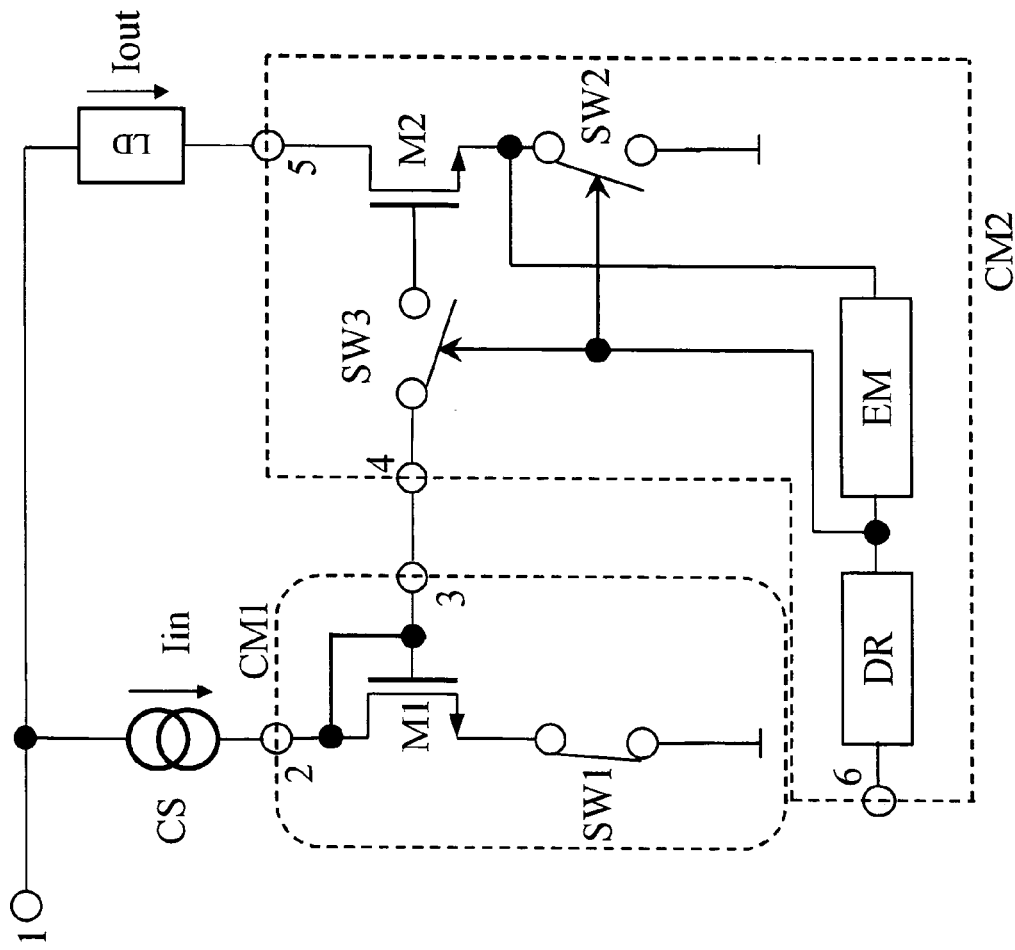
FIG. 14 is a circuit diagram illustrating the structure of a current source apparatus according to a sixth embodiment of the present invention.
Figure 15:
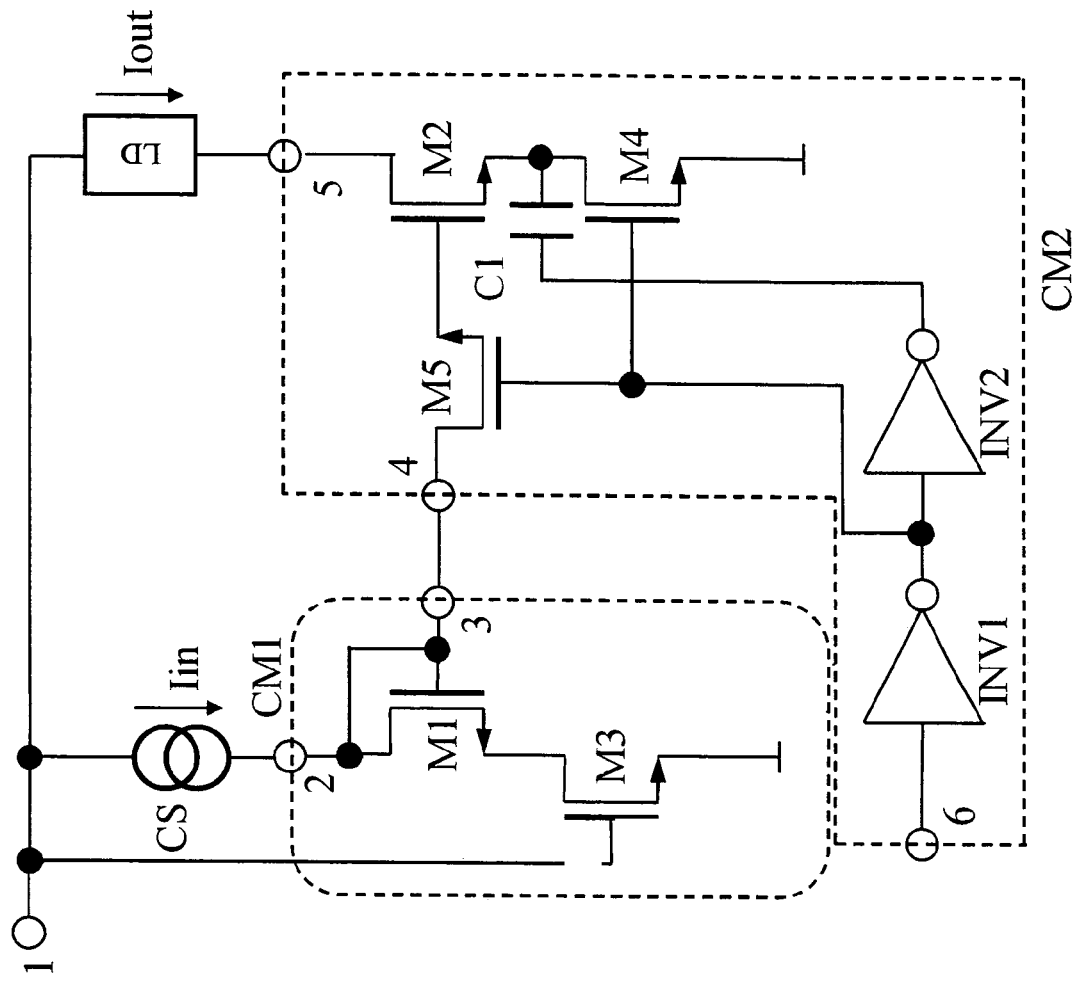
FIG. 15 is a circuit diagram illustrating a more specific structure of the current source apparatus according to the sixth embodiment of the present invention.

Although p-channel MOS transistors are used as the MOS transistors M1 to M5 in the fifth embodiment, n-channel MOS transistors may be used as shown in FIGS. 14 and 15 (sixth embodiment).

Figure 16:
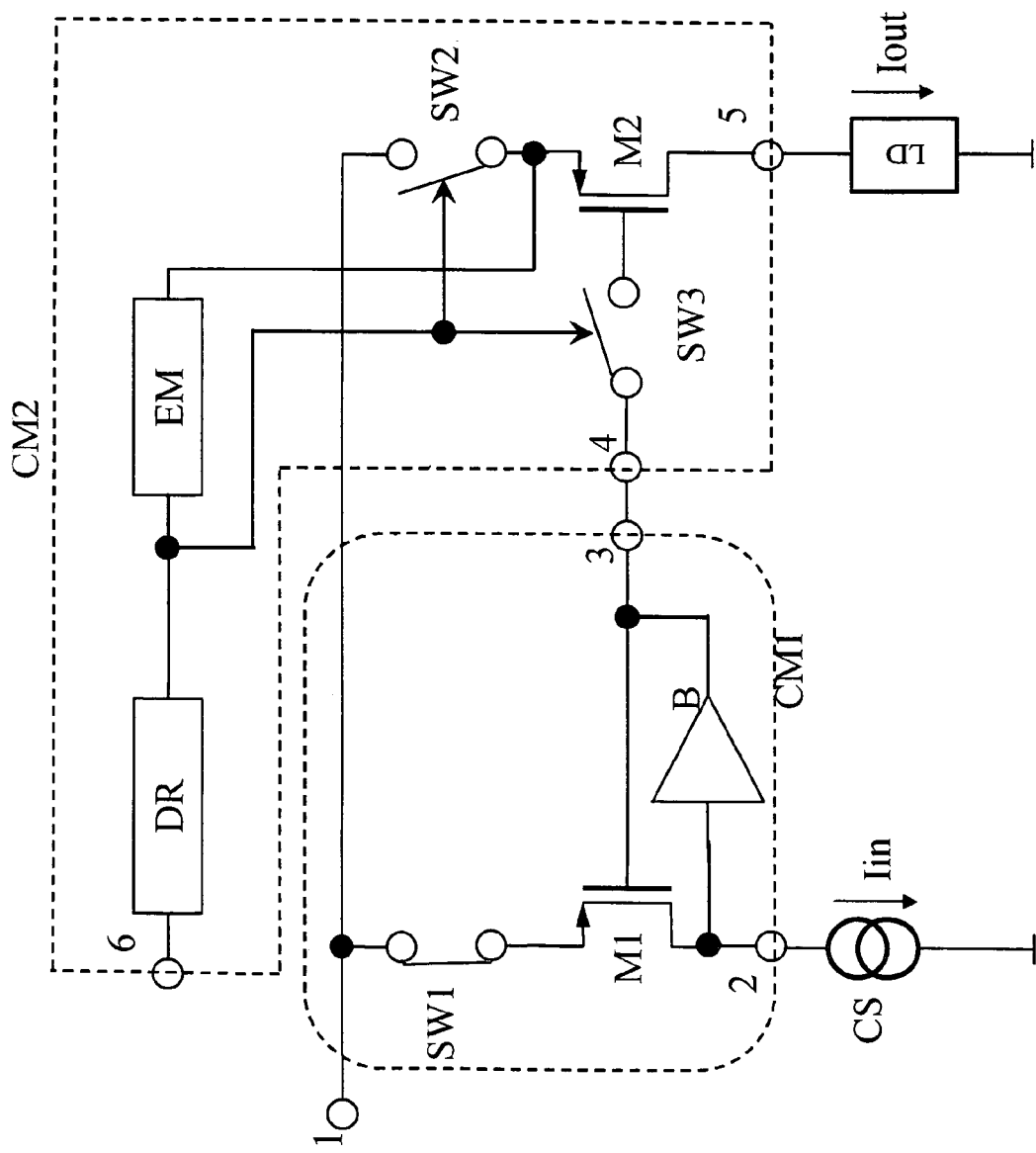
FIG. 16 is a circuit diagram illustrating the structure of a current source apparatus according to a seventh embodiment of the present invention.
Figure 17:
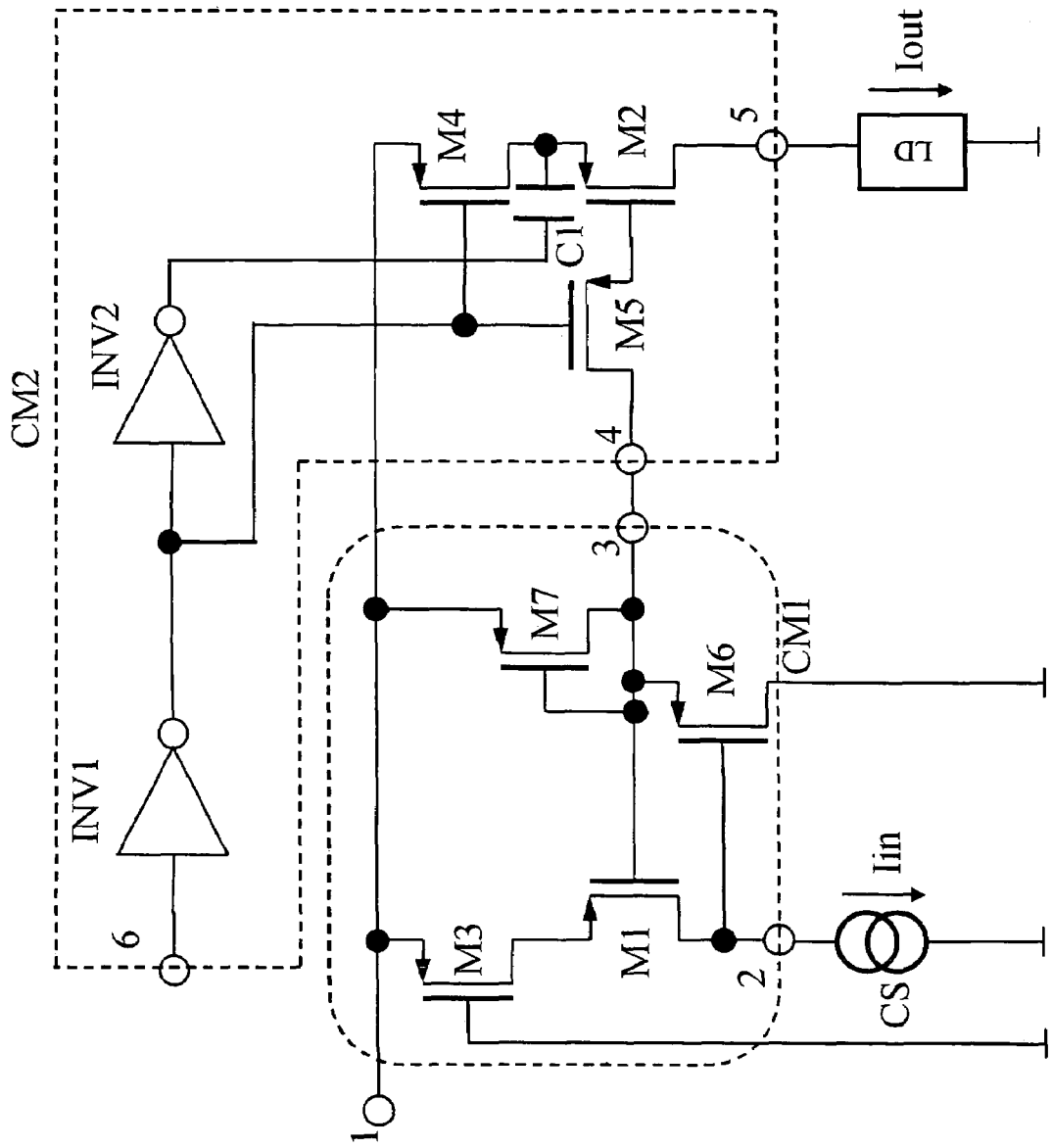
FIG. 17 is a circuit diagram illustrating a more specific structure of the current source apparatus according to the seventh embodiment of the present invention.

FIG. 16 shows a circuit diagram of a current source apparatus according to the seventh embodiment. In FIG. 17 which shows a more specific circuit, a symbol "C1" denotes a capacitor. A symbol "INV2" denotes an inverter logic circuit which drives the capacitor. The capacitor C1 and the inverter logic circuit INV2 constitute the emphasis circuit EM, and operates as a circuit to improve the rising and falling response of the current Iout.

The operation of the current source apparatus according to the seventh embodiment with the above-described structure will be discussed referring to FIG. 17. The current source apparatus operates like current source apparatus in FIG. 8, except the capacitor C1 and the inverter logic circuit INV2, which constitute the emphasis circuit EM, and outputs the current Iout. The pulse from the inverter logic circuit INV2 drives the capacitor C1, the ON resistor of the MOS transistor M4 and the source of the MOS transistor M2. This allows the current of the differential component to be added to the current Iout via the MOS transistor M2 in the gate-grounded fashion. As the adequate selection of the constant of the capacitor C1 can pass only a high-frequency component, the rising part and the falling part of the current Iout are emphasized as shown in FIG. 13, thus ensuring faster rising and falling than achieved by the first embodiment.

According to the seventh embodiment, as described above, the rising and falling of the current Iout are emphasized by the emphasis circuit. This can ensure faster interruption of the current Iout, thus further enhancing the linearity of the current Iout. The other advantages are the same as those of the third embodiment.

Figure 18:
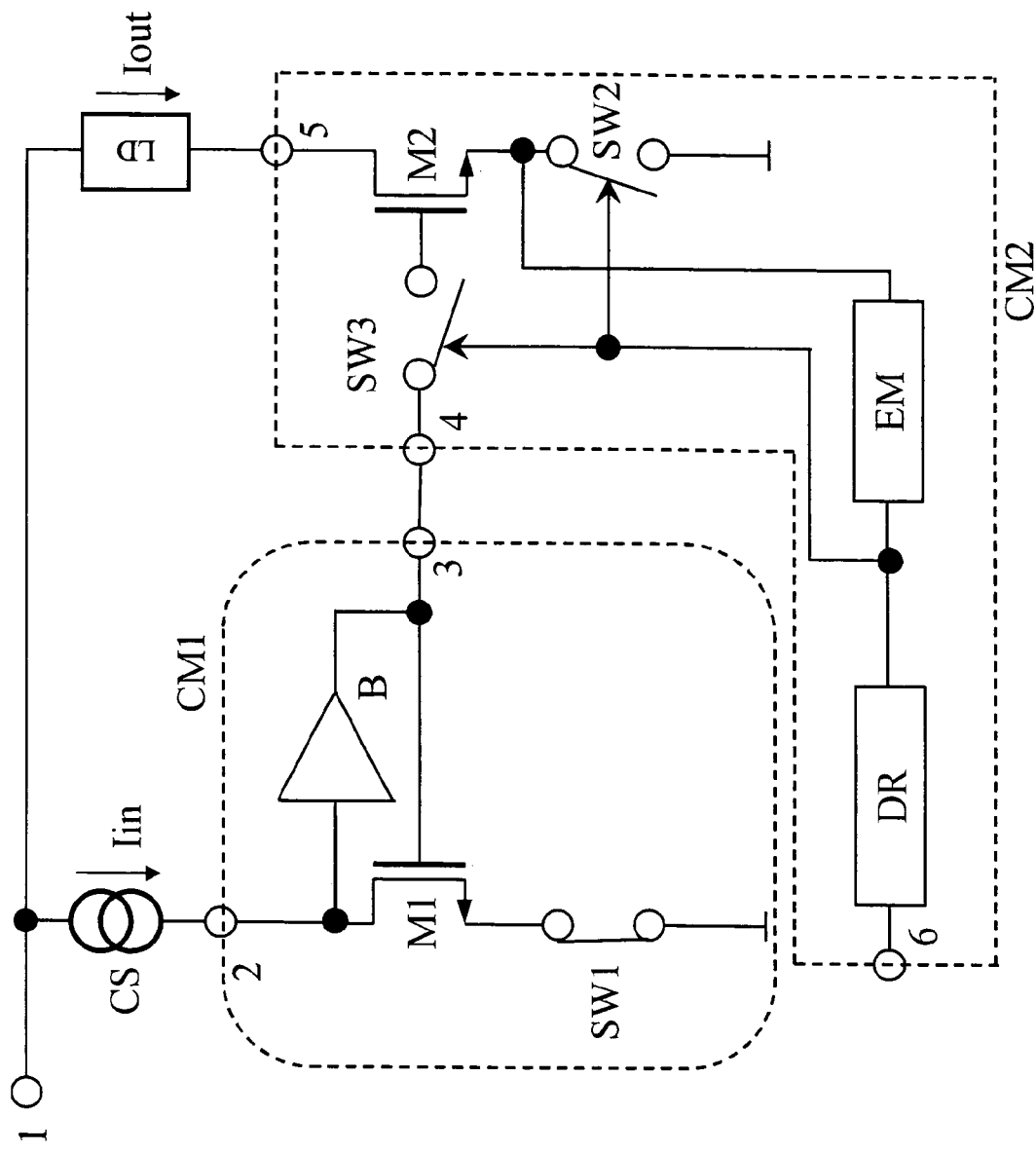
FIG. 18 is a circuit diagram illustrating the structure of a current source apparatus according to an eighth embodiment of the present invention.
Figure 19:
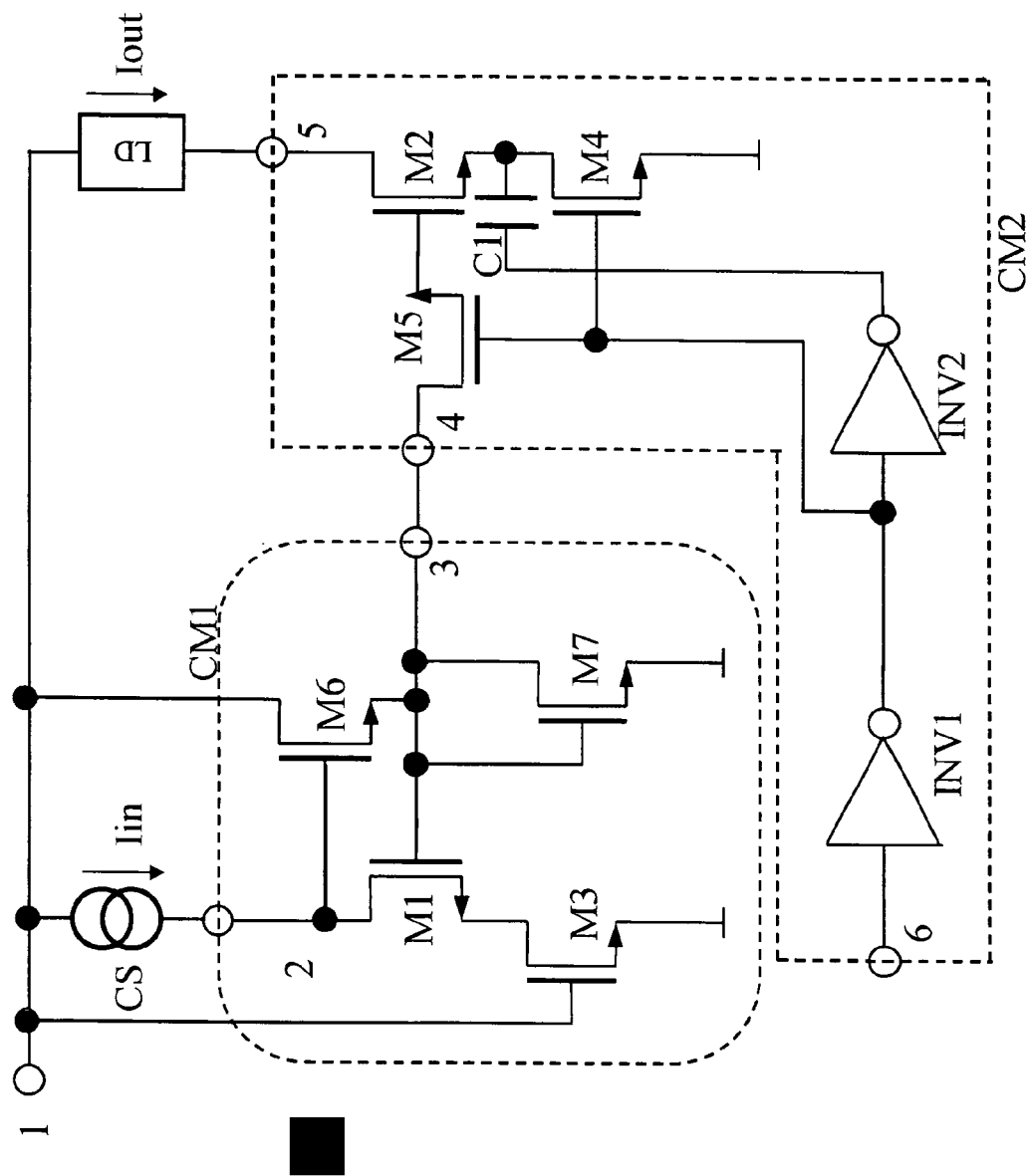
FIG. 19 is a circuit diagram illustrating a more specific structure of the current source apparatus according to the eighth embodiment of the present invention.

Although p-channel MOS transistors are used as the MOS transistors M1 to M7 in the seventh embodiment, n-channel MOS transistors may be used as shown in FIGS. 18 and 19 (eighth embodiment).

Figure 20:
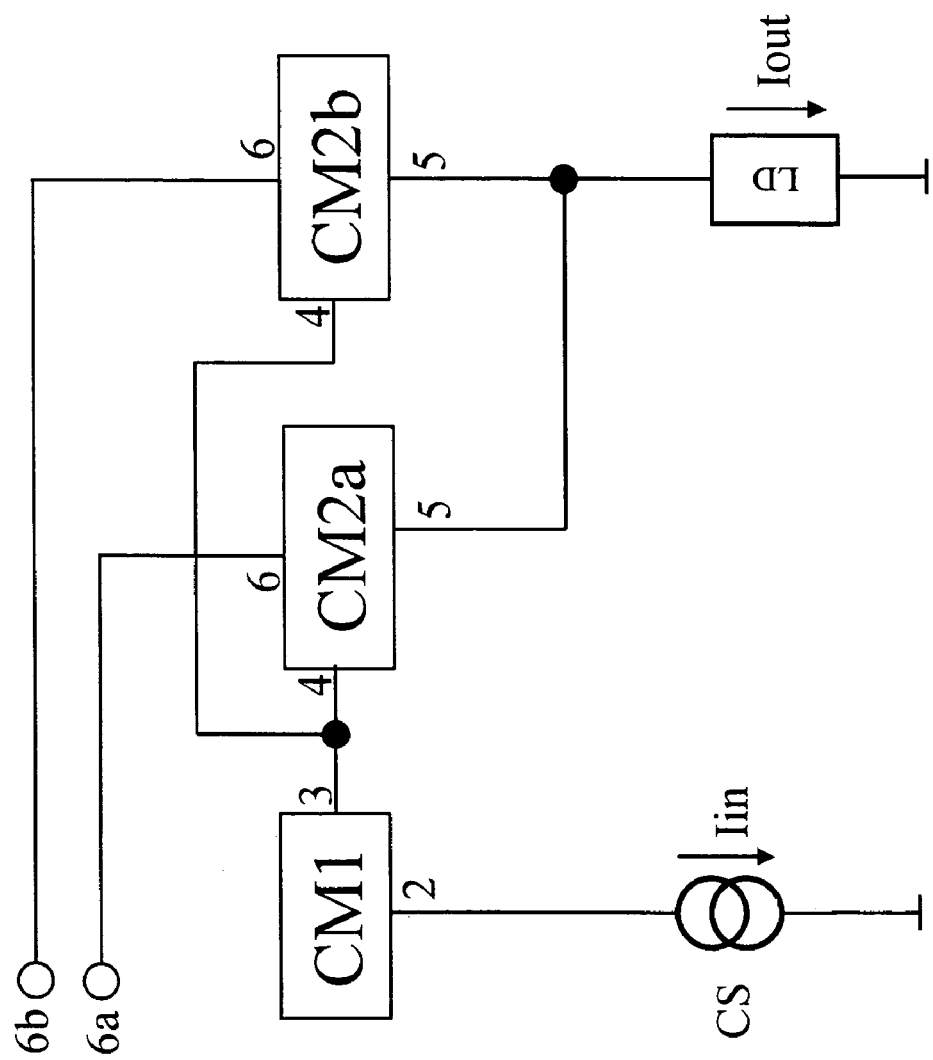
FIG. 20 is a circuit diagram illustrating the structure of a light-emitting-device drive apparatus according to a ninth embodiment of the present invention.

FIG. 20 shows a circuit diagram of a light-emitting-device drive apparatus according to the ninth embodiment. In FIG. 20, a symbol "CM1" denotes an input-side circuit of a current mirror to which the current is input. Symbols "CM2a" and "CM2b" denote output-side circuits which output currents. Symbols "6a" and "6b" denote control-signal input terminals.

Figure 21:
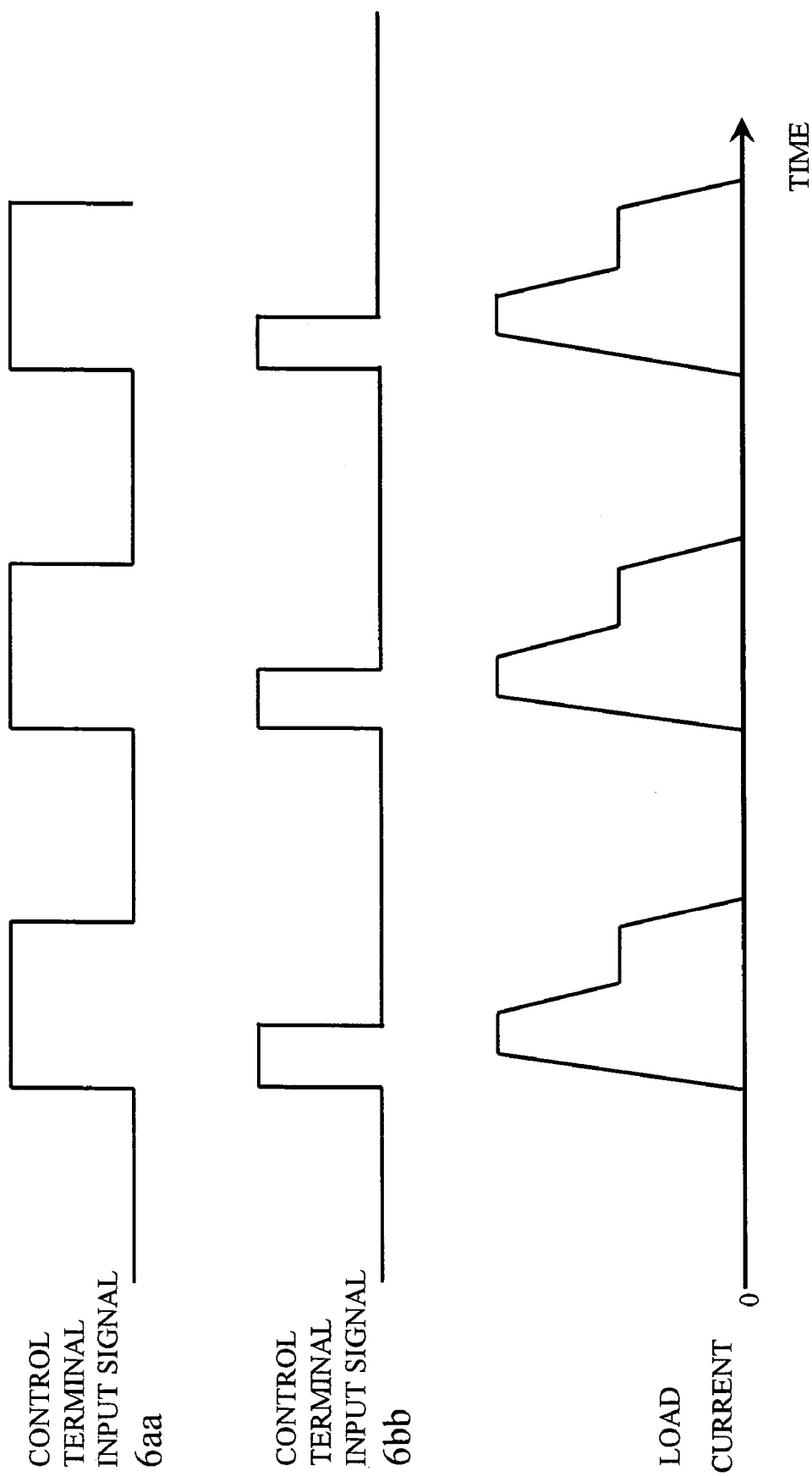
FIG. 21 is a waveform diagram for explaining the operations of the light-emitting-device drive apparatuses according to the ninth and tenth embodiments of the present invention.

The operation of the light-emitting-device drive apparatus according to the ninth embodiment with the above-described structure will be discussed referring to a waveform diagram in FIG. 21. FIG. 21 shows a control terminal input signal 6aa to be applied to the control-signal input terminal 6a, a control terminal input signal 6bb to be applied to the control-signal input terminal 6b, and the load current flowing across the load LD.

The following will discuss a case where the light-emitting-device drive apparatus is constructed by using the current source apparatus according to the first embodiment as an example. When the current mirror output-side circuit CM2a operates according to the control terminal input signal 6aa which is at a high level, the current is output at a high speed. When the current mirror output-side circuit CM2b operates according to the control terminal input signal 6bb which is at a high level, the current is output at a high speed. The load current is combined by the individual terminals 5 of the output-side circuits CM2a and CM2b. Then, the sum of the current in the current mirror output-side circuit CM2a and the current in the current mirror output-side circuit CM2b is supplied to the light emitting device or the load LD. An arbitrary current waveform can be synthesized by setting the current output timings of the current mirror output-side circuit CM2a and the current mirror output-side circuit CM2b and the ratio of the size of the output-side circuit CM2a to the size of the output-side circuit CM2b. This structure can permit the light emitting device as a load to be driven with the arbitrary amount of light emission.

As the light-emitting-device drive apparatus according to the ninth embodiment has the current source apparatus of the first embodiment, it is possible to switch between the light-ON state and the light-OFF state of the light emitting device at a high speed to linearly change the amount of light emission.

Figure 22:
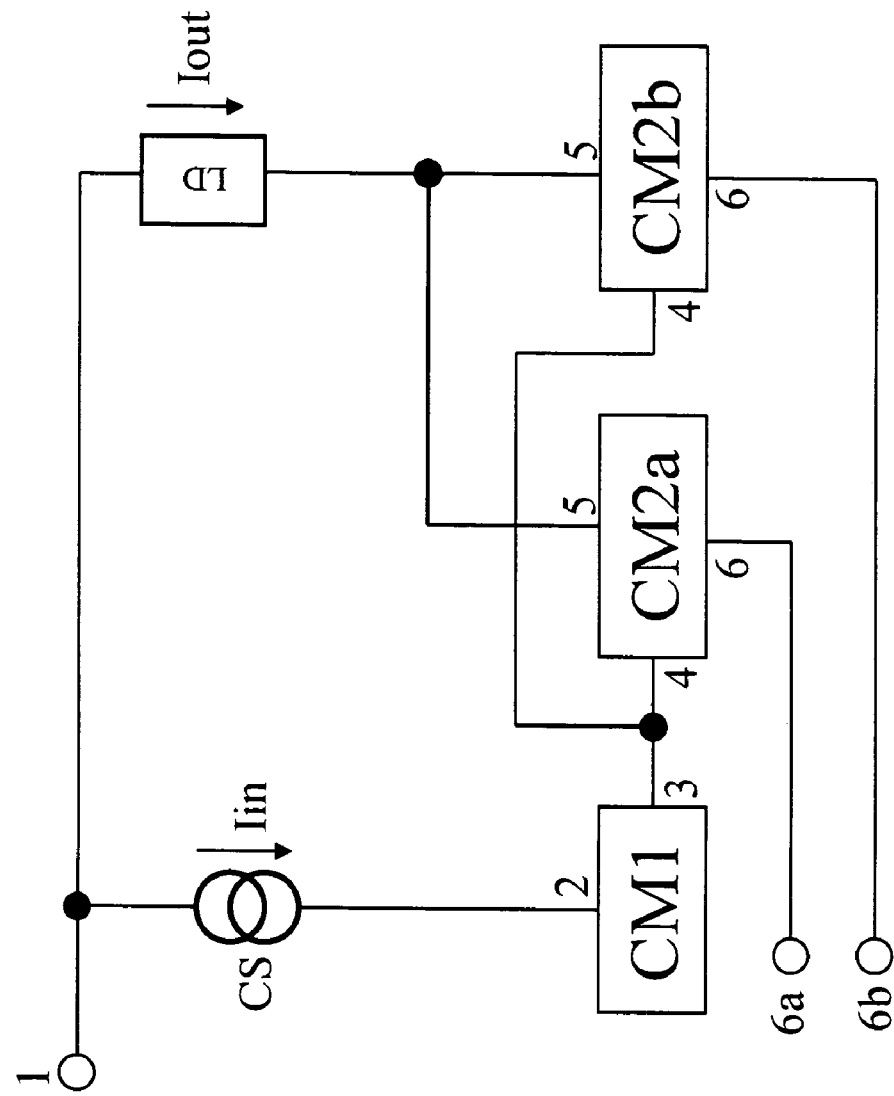
FIG. 22 is a circuit diagram illustrating the structure of the light-emitting-device drive apparatus according to the tenth embodiment of the present invention.

Although the ninth embodiment uses the current source apparatus according to the first embodiment, any one of the current source apparatuses according to the first, third, fifth and seventh embodiments may be used as well. Although a current source apparatus comprised of p-channel MOS transistors is used in the ninth embodiment, a current source apparatus comprised of n-channel MOS transistors may be used as shown in FIG. 22 (tenth embodiment). In this case, one of the current source apparatuses according to the second, fourth, sixth and eighth embodiments is used.

Figure 23:
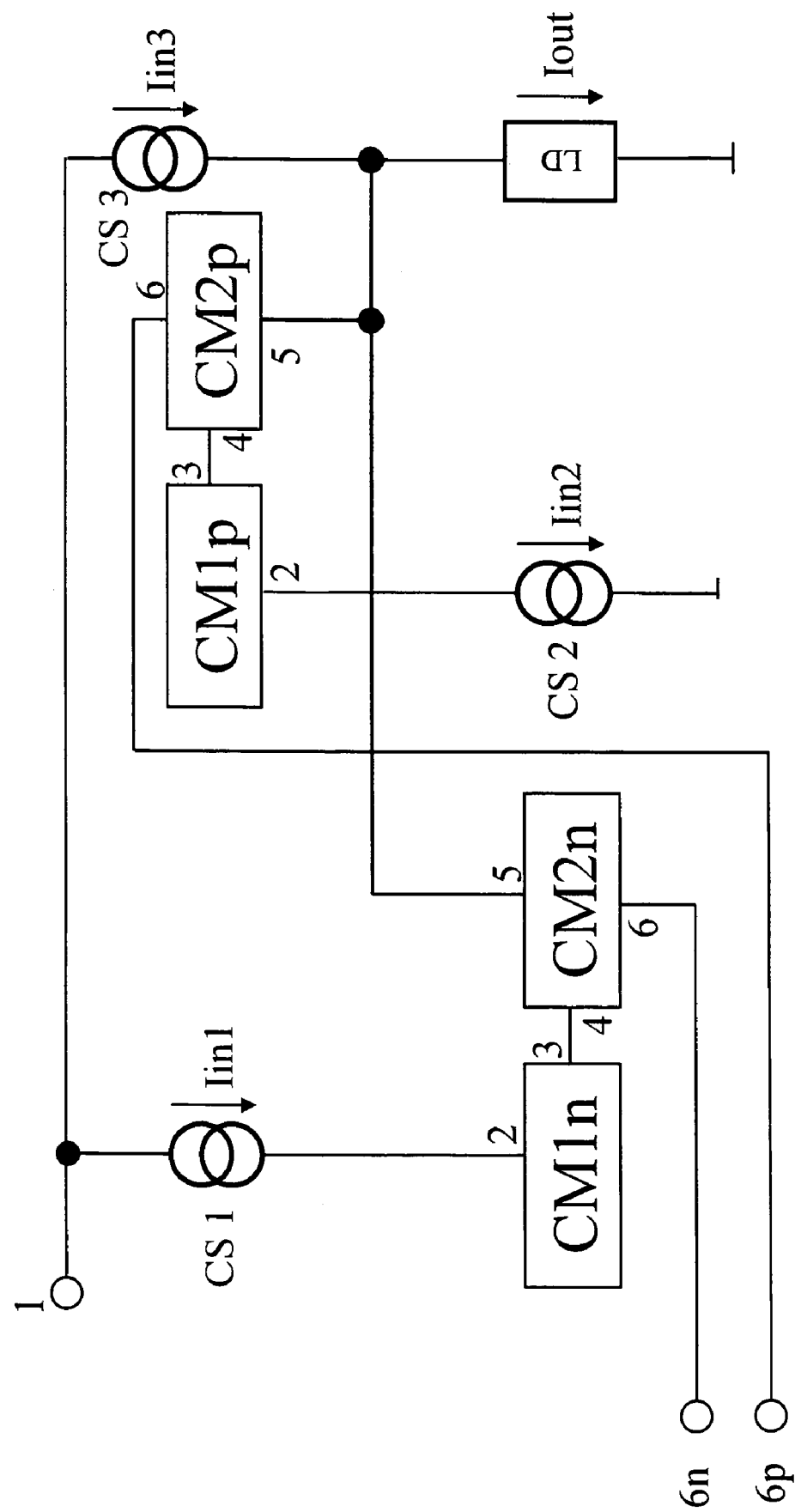
FIG. 23 is a circuit diagram illustrating the structure of a light-emitting-device drive apparatus according to an eleventh embodiment of the present invention.

Further, the light-emitting-device drive apparatus may take a structure including both a current source apparatus comprised of p-channel MOS transistors and a current source apparatus comprised of n-channel MOS transistors as shown in FIG. 23 (eleventh embodiment). In FIG. 23, a symbol "CM1p" denotes a current mirror input-side circuit comprised of p-channel MOS transistors. A symbol "CM2p" denotes a current mirror output-side circuit comprised of p-channel MOS transistors. A symbol "CM1n" denotes a current mirror input-side circuit comprised of n-channel MOS transistors. A symbol "CM2n" denotes a current mirror output-side circuit comprised of n-channel MOS transistors. Symbols "CS1", "CS2" and "CS3" denote current sources. Symbols "Iin1", "Iin2" and "Iin3" denote currents.

Figure 24:
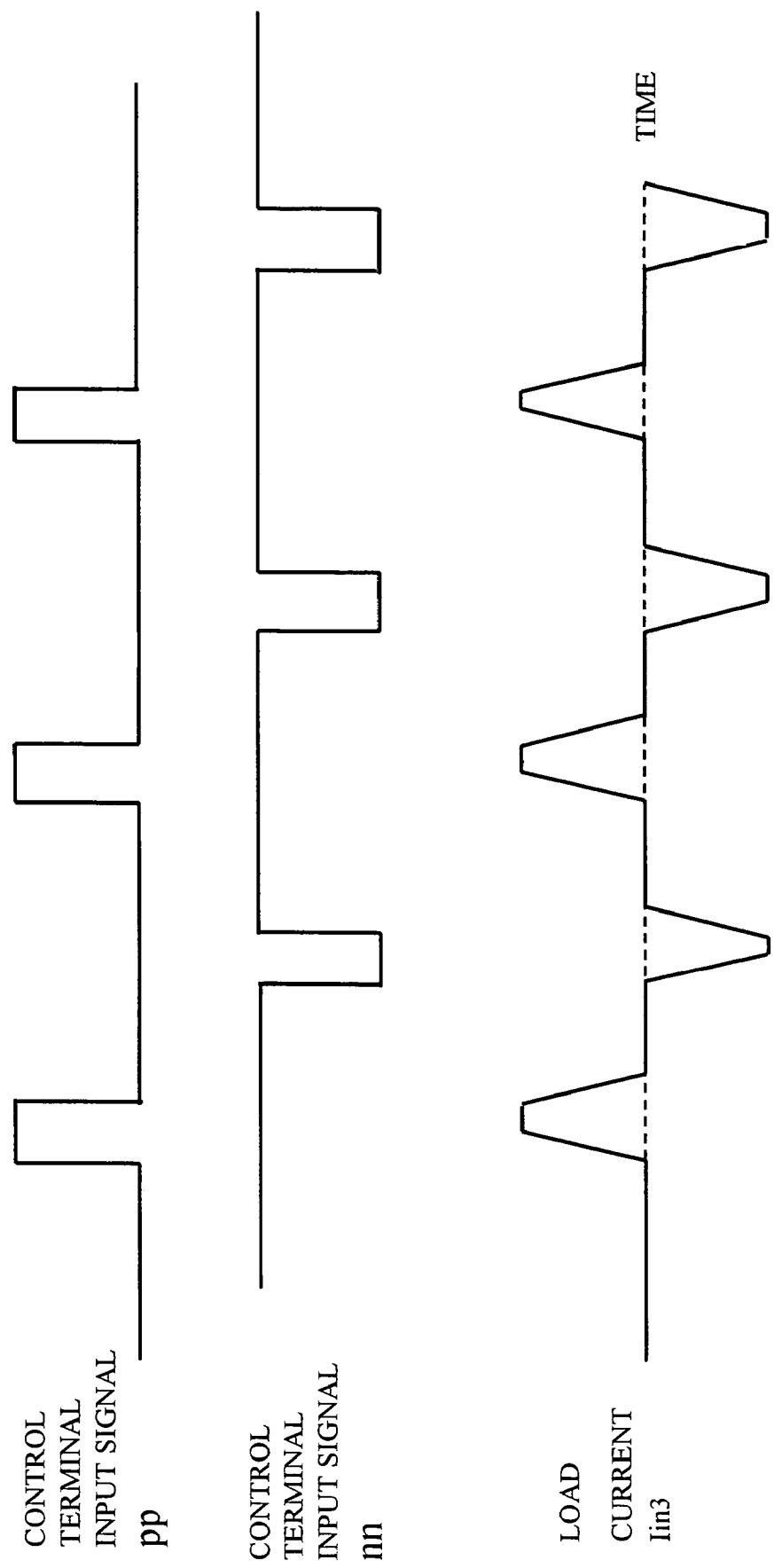
FIG. 24 is a waveform diagram for explaining the operations of the light-emitting-device drive apparatuses according to the eleventh and twelfth embodiments of the present invention.

This structure can provide current waveforms as shown in FIG. 24, which shows the waveforms of a control terminal input signal pp on the p-channel side, a control terminal input signal nn on the n-channel side, and the load current flowing across the load. A load current Iout increases or decreases with the current Iin3 as a reference.

Figure 25:
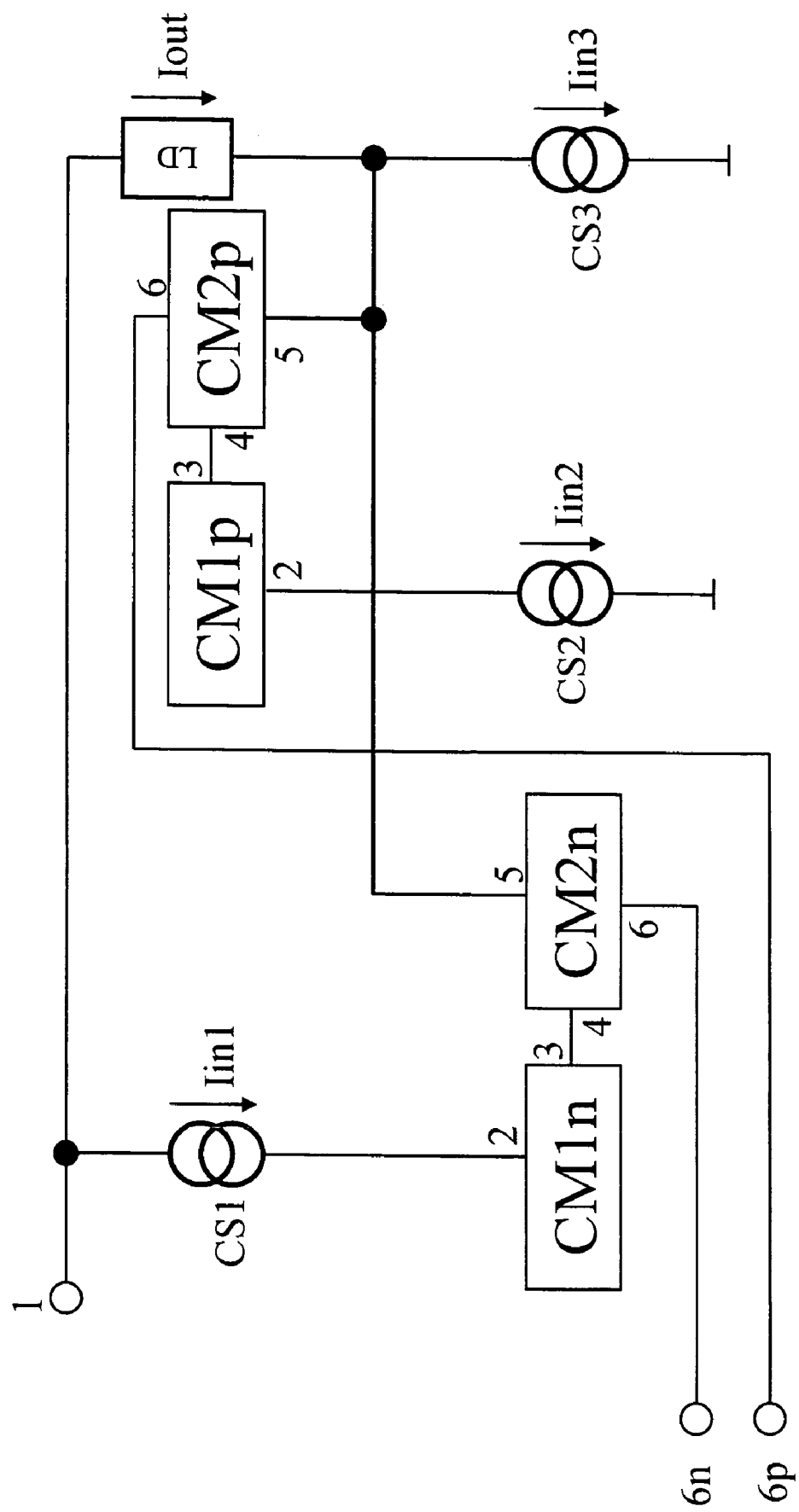
FIG. 25 is a circuit diagram illustrating the structure of the light-emitting-device drive apparatus according to the twelfth embodiment of the present invention.

FIG. 25 shows a structure in which the position of the load LD and the position of the current Iin3 are reversed to those in FIG. 23 (twelfth embodiment). The operation of the circuit is the same as that of the circuit in FIG. 23.

Figure 26:
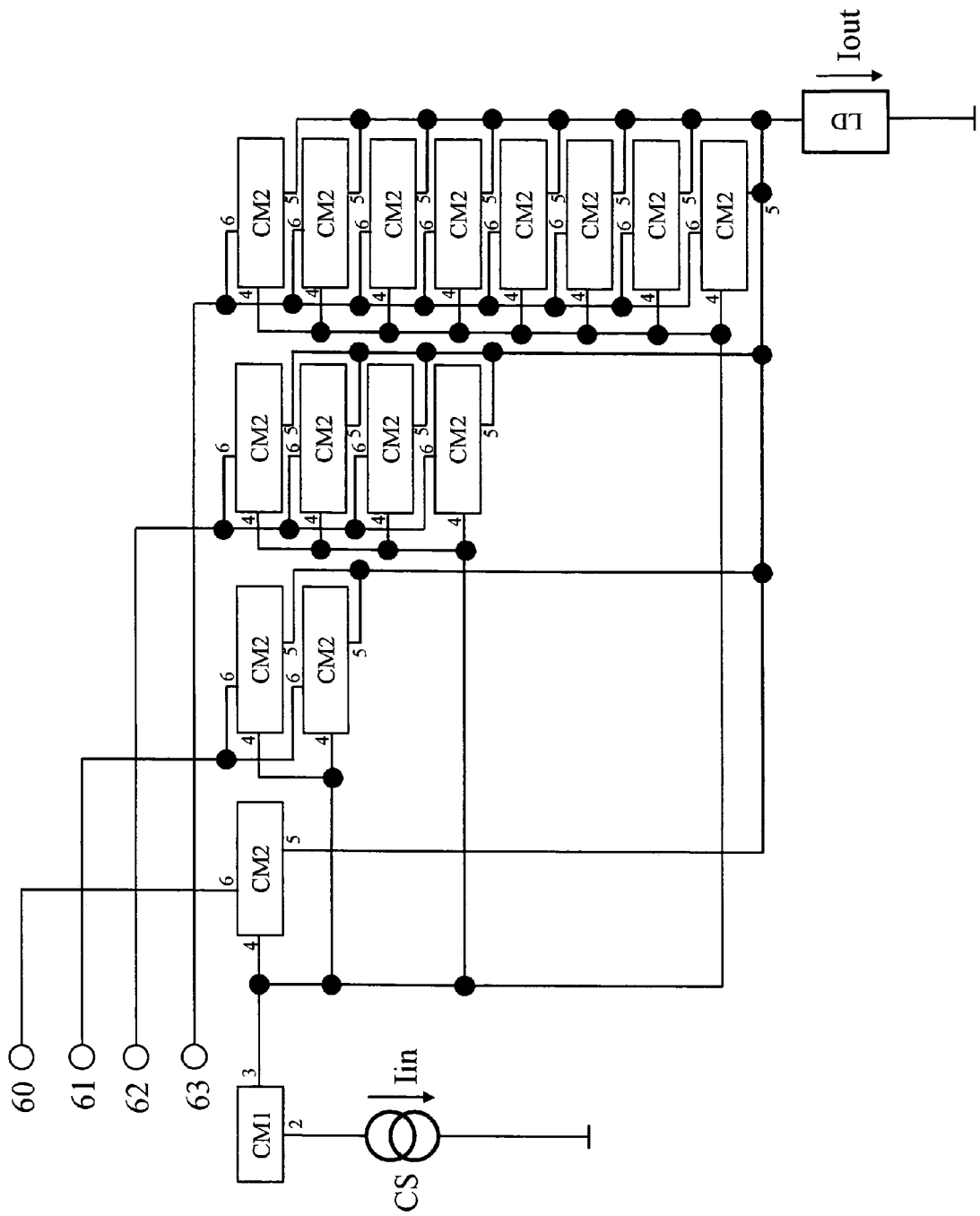
FIG. 26 is a circuit diagram illustrating the structure of a digital-analog converting apparatus according to a thirteenth embodiment of the present invention.

FIG. 26 is a circuit diagram exemplifying the structure of a 4-bit digital-analog converting apparatus according to the thirteenth embodiment. In FIG. 26, a symbol "60" denotes a terminal to which the least significant bit (first bit) of 4-bit data is input. A symbol "61" denotes a terminal to which the second bit of 4-bit data is input. A symbol "62" denotes a terminal to which the third bit of 4-bit data is input. A symbol "64" denotes a terminal to which the most significant bit (fourth bit) of 4-bit data is input.

The operation of the digital-analog converting apparatus according to the thirteenth embodiment with the above-described structure will be discussed referring to FIG. 26. The following will discuss a case where the digital-analog converting apparatus is constructed by using the current source apparatus according to the first embodiment as a single current mirror input-side circuit CM1 and plural current mirror output-side circuits CM2 as an example.

Provided that the ratio of the size of each of the output-side circuits CM2 to the size of the current mirror input-side circuit CM1 is constant (the same size), the current value can be weighted according to the number of the current mirror output-side circuits CM2 to be connected to the respective terminals 60 to 63.

Adding and combining the output currents of all the current mirror output-side circuits CM2, the current Iout flowing across the load is converted at a high speed to an analog amount according to the digital amount to be input from the terminals 60 to 63.

As the thirteenth embodiment has the current source apparatus according to the first embodiment, it is possible to achieve an excellent digital-analog converting apparatus capable of interrupting the current at a high speed and linearly changing the current amount.

While the digital-analog converting apparatus according to the thirteenth embodiment takes a 4-bit structure, the digital-analog converting apparatus can take a structure of arbitrary bits.

Although the thirteenth embodiment uses the current source apparatus according to the first embodiment, any one of the current source apparatuses according to the first, third, fifth and seventh embodiments may be used.

Figure 27:
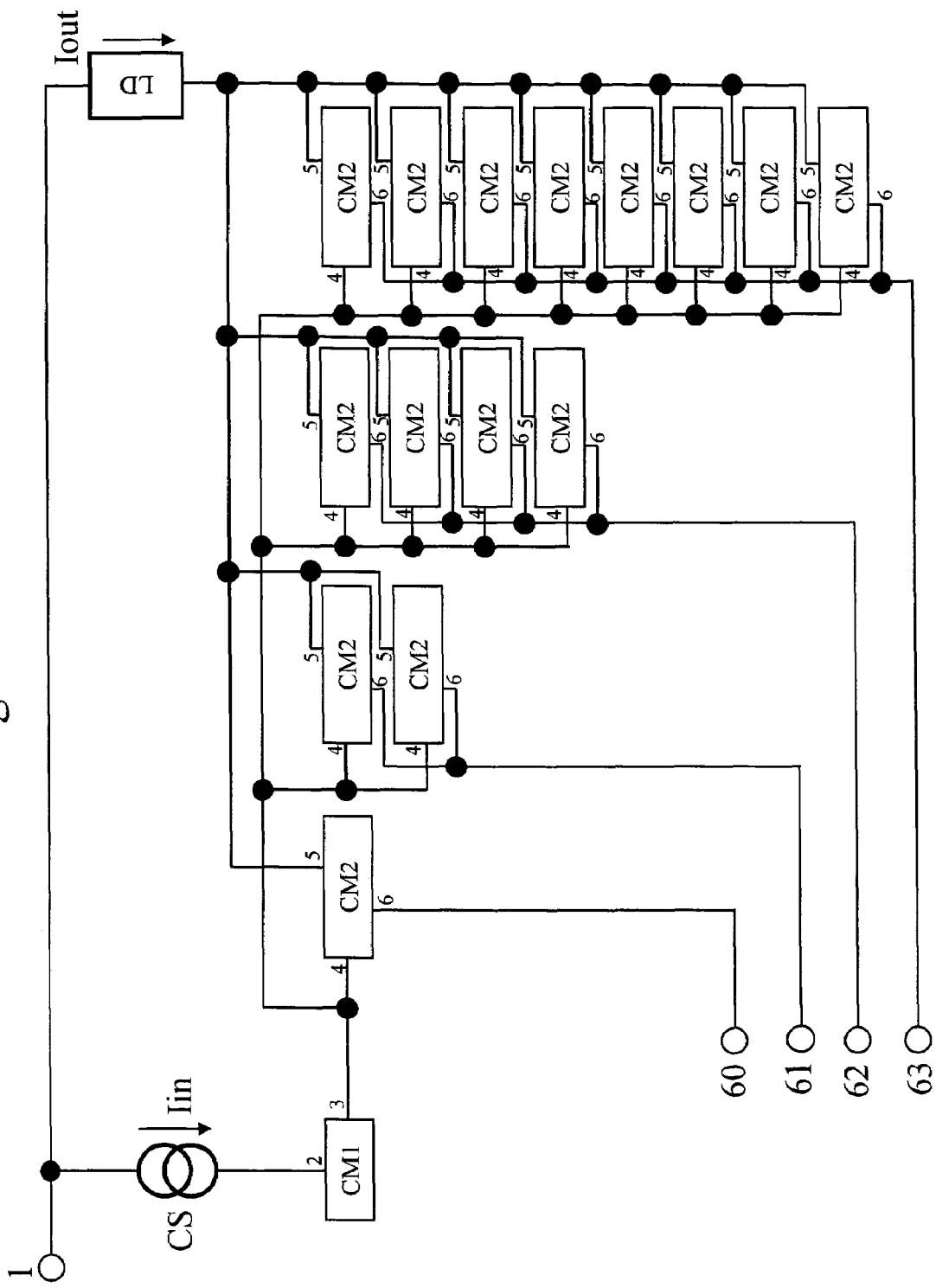
FIG. 27 is a circuit diagram illustrating the structure of a digital-analog converting apparatus according to a fourteenth embodiment of the present invention.
Figure 28:
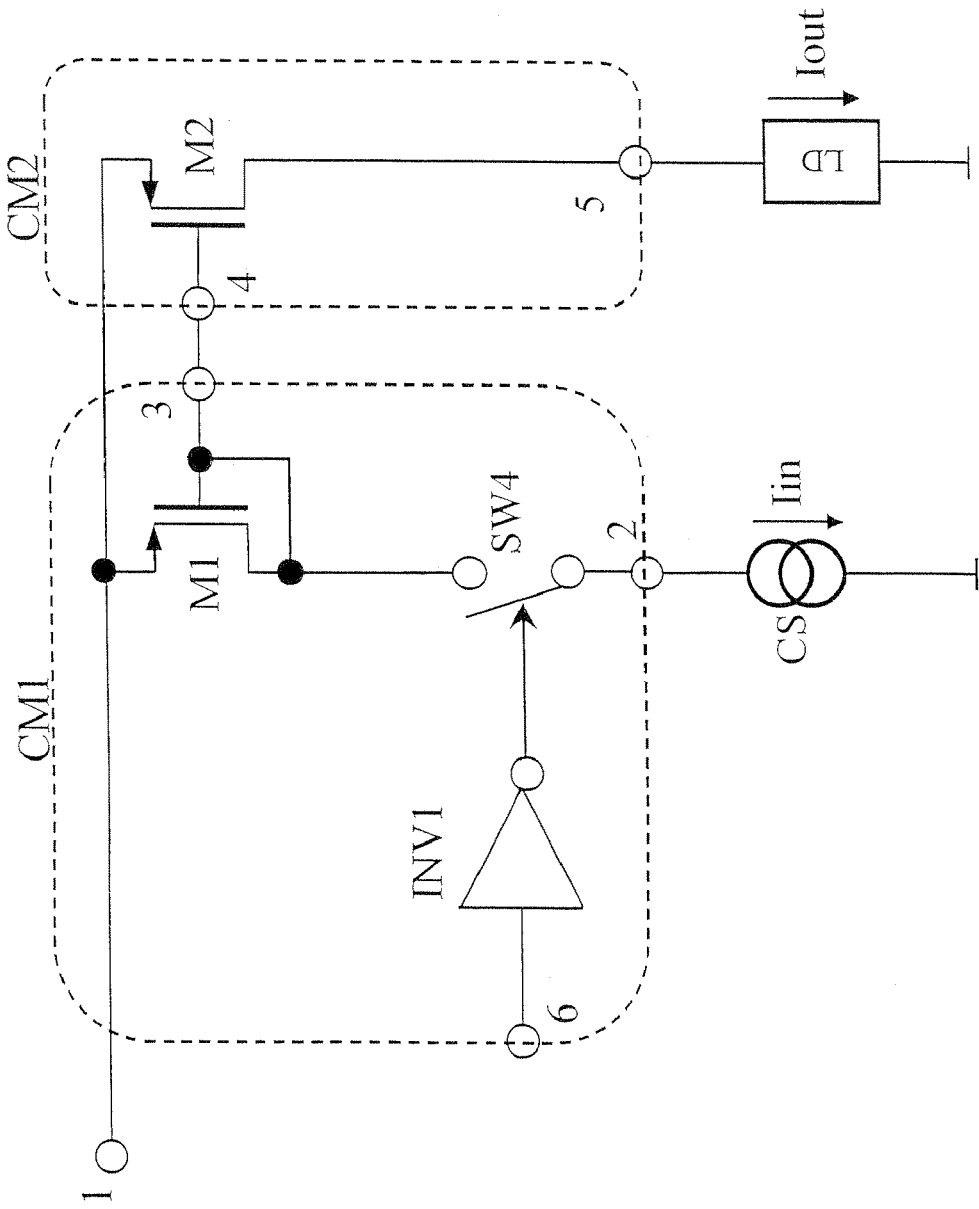
FIG. 28 is a circuit diagram illustrating the structure of a current source apparatus according to the first prior art.
Figure 29:
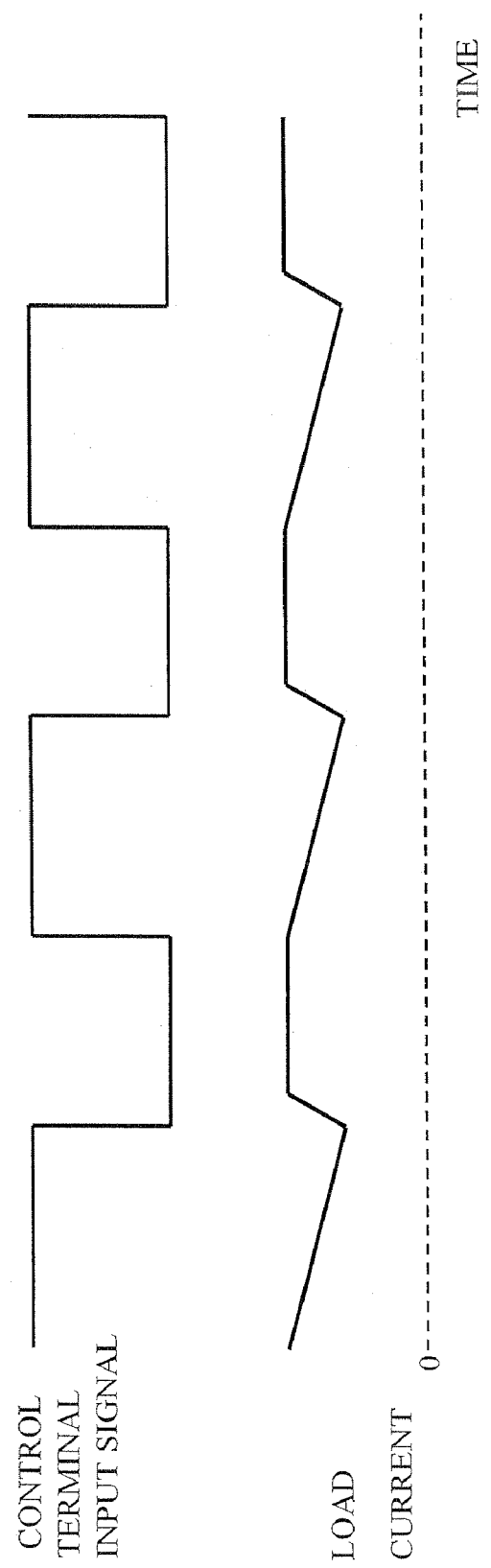
FIG. 29 is a waveform diagram for explaining the operation of the current source apparatus according to the first prior art.
Figure 30:
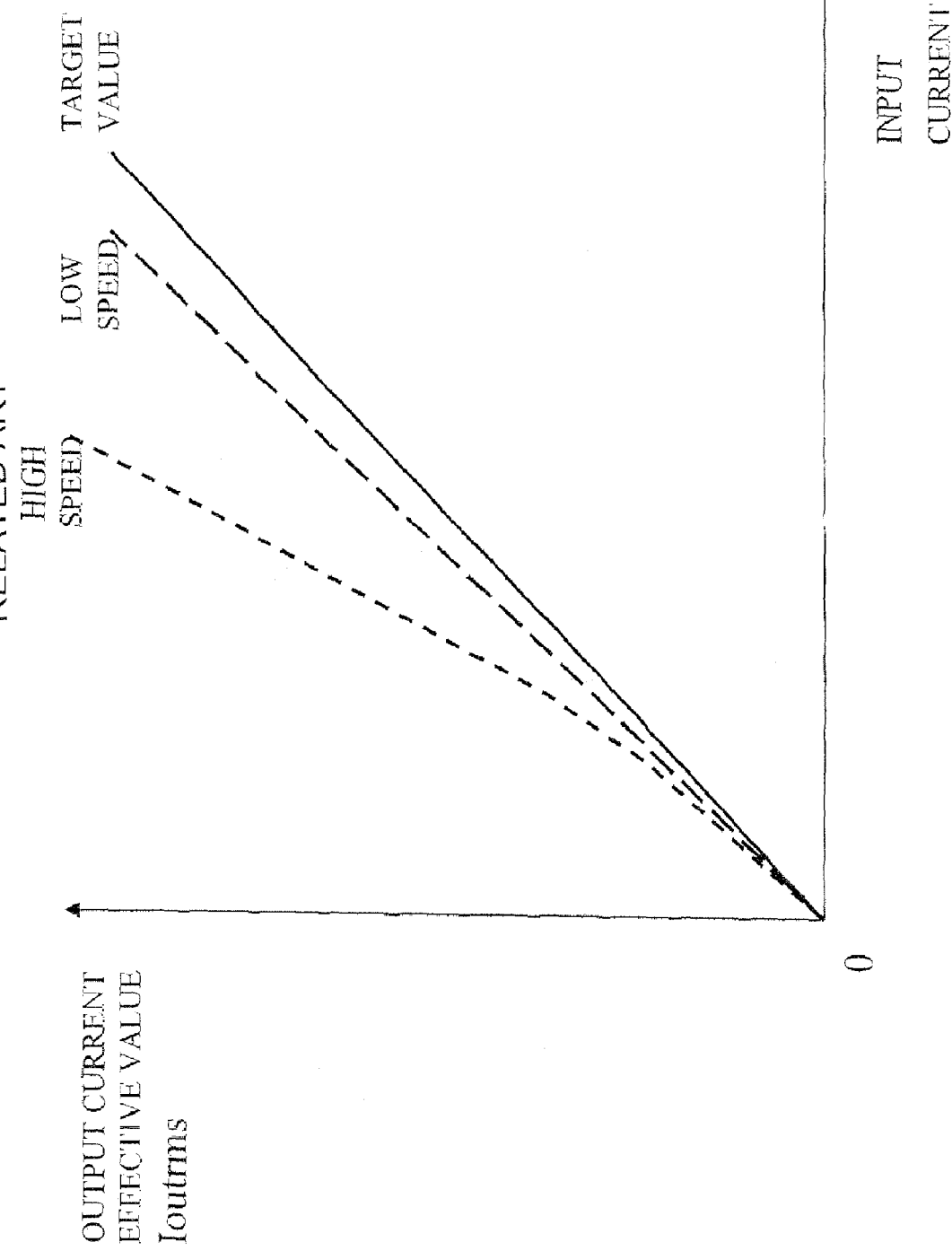
FIG. 30 is a characteristic diagram of the input current v.s. output current root-mean-square value for explaining the operation of the current source apparatus according to the first prior art.
Figure 31:
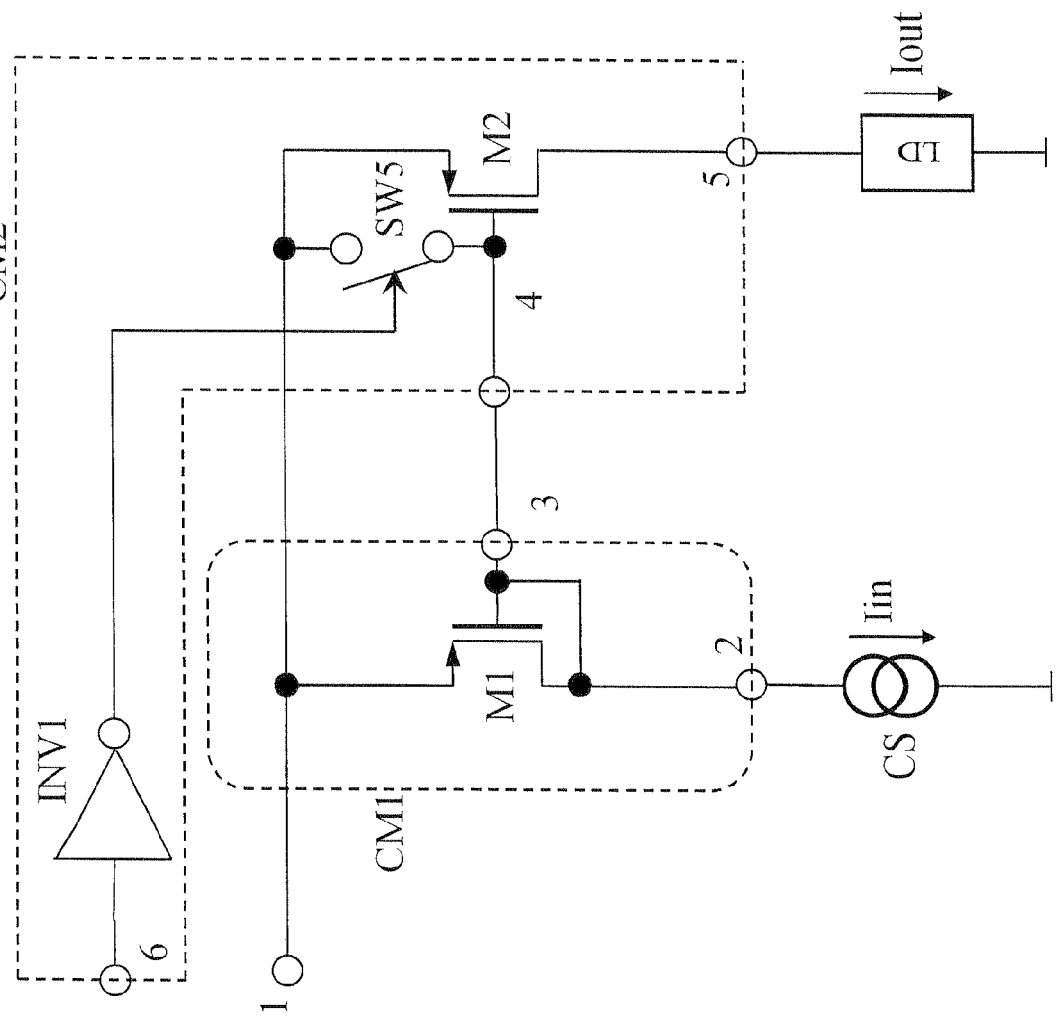
FIG. 31 is a circuit diagram illustrating the structure of a current source apparatus according to the second prior art.
Figure 32:
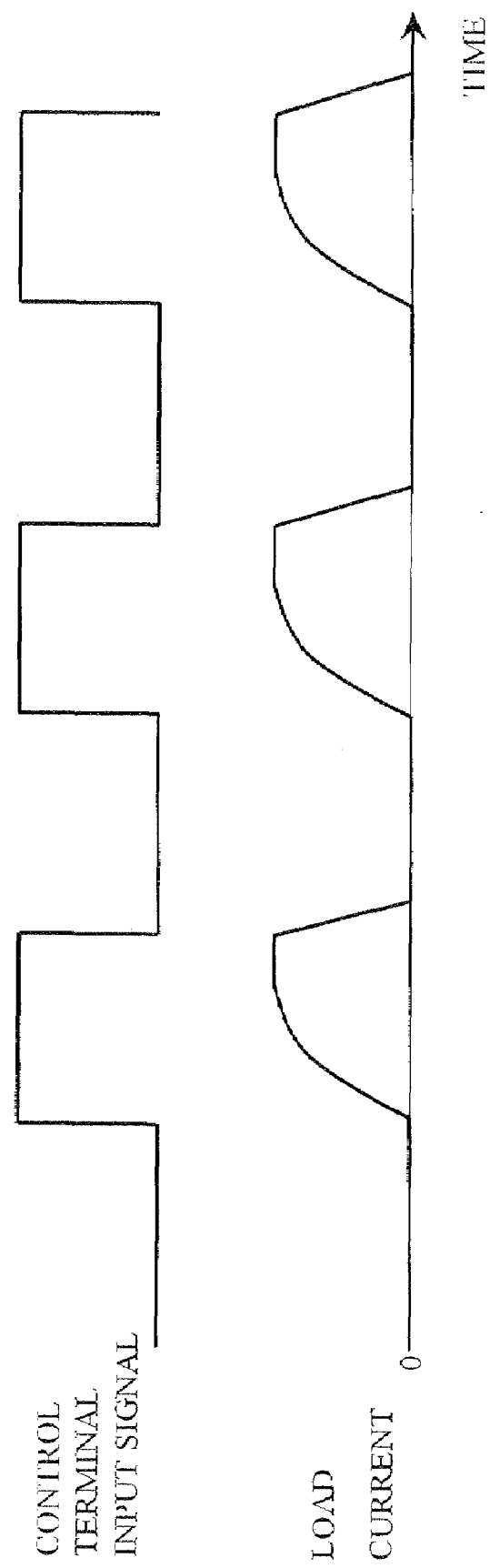
FIG. 32 is a waveform diagram for explaining the operation of the current source apparatus according to the second prior art.
Figure 33:
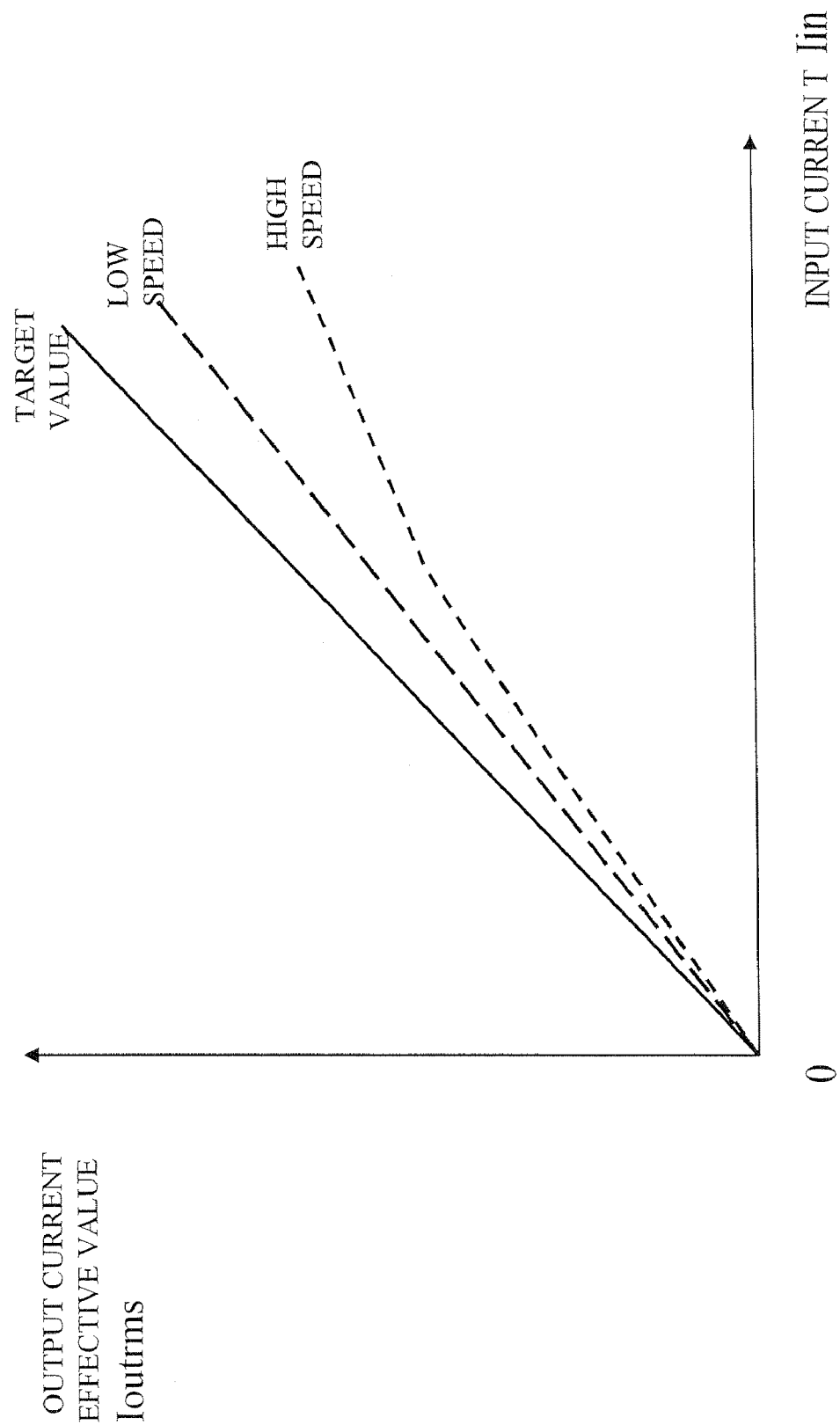
FIG. 33 is a characteristic diagram of the input current v.s. output current root-mean-square value for explaining the operation of the current source apparatus according to the second prior art.
Figure 34:
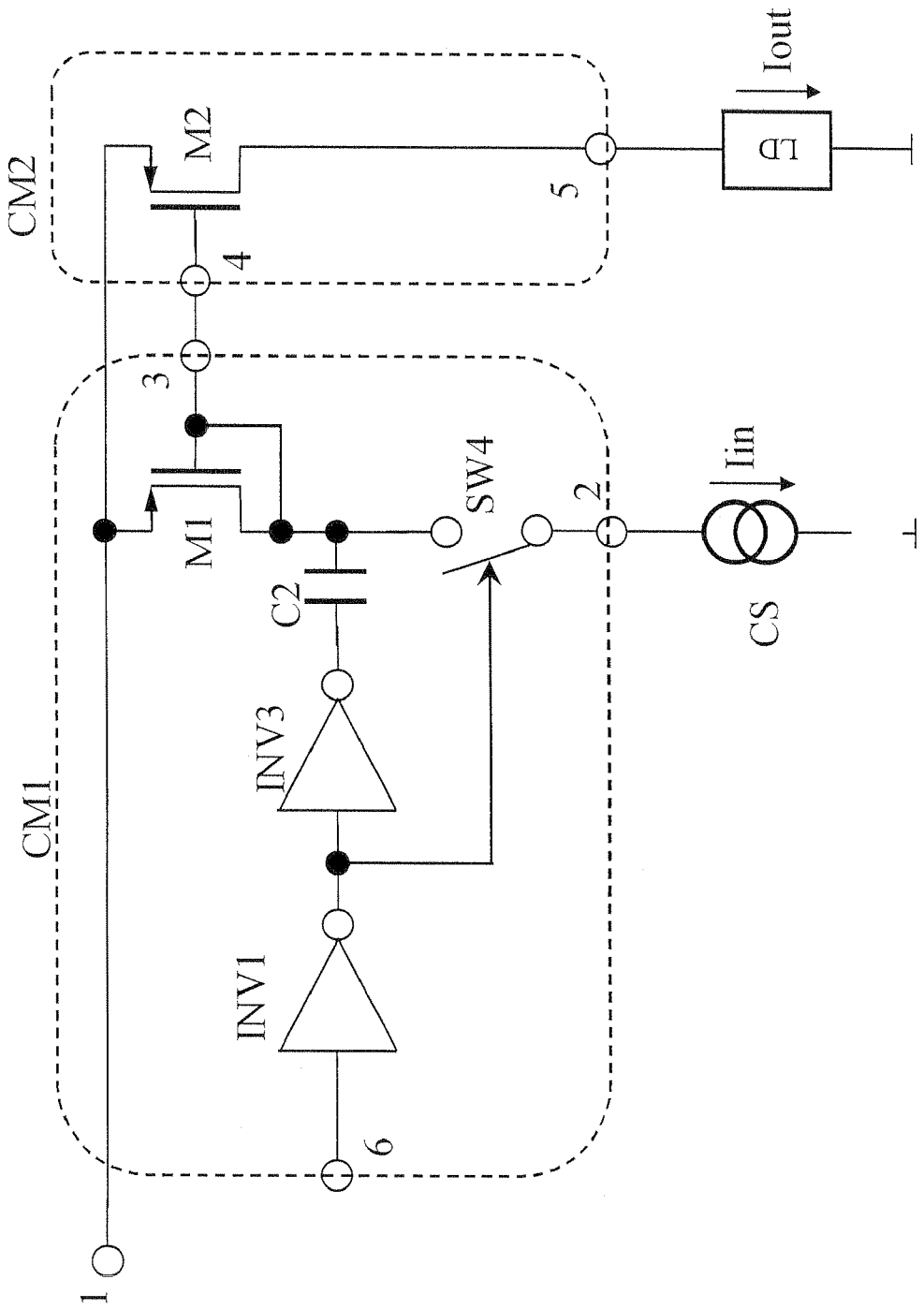
FIG. 34 is a circuit diagram illustrating the structure of a current source apparatus according to the third prior art.
Figure 35:
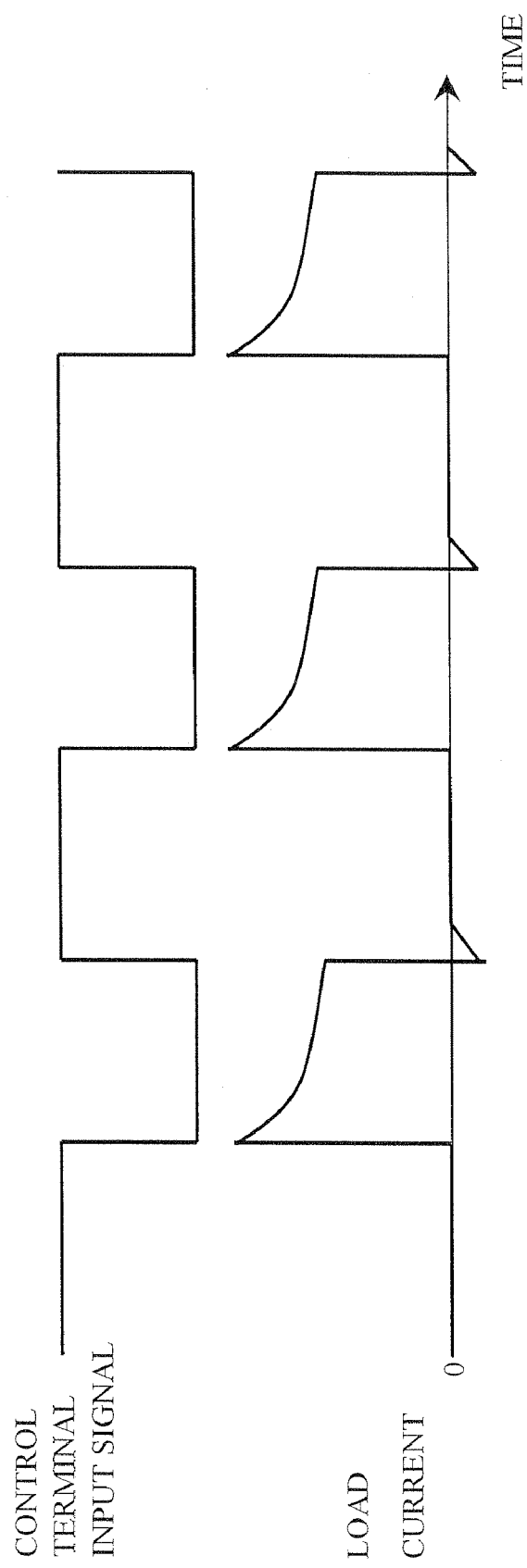
FIG. 35 is a waveform diagram for explaining the operation of the current source apparatus according to the third prior art.
Figure 36:
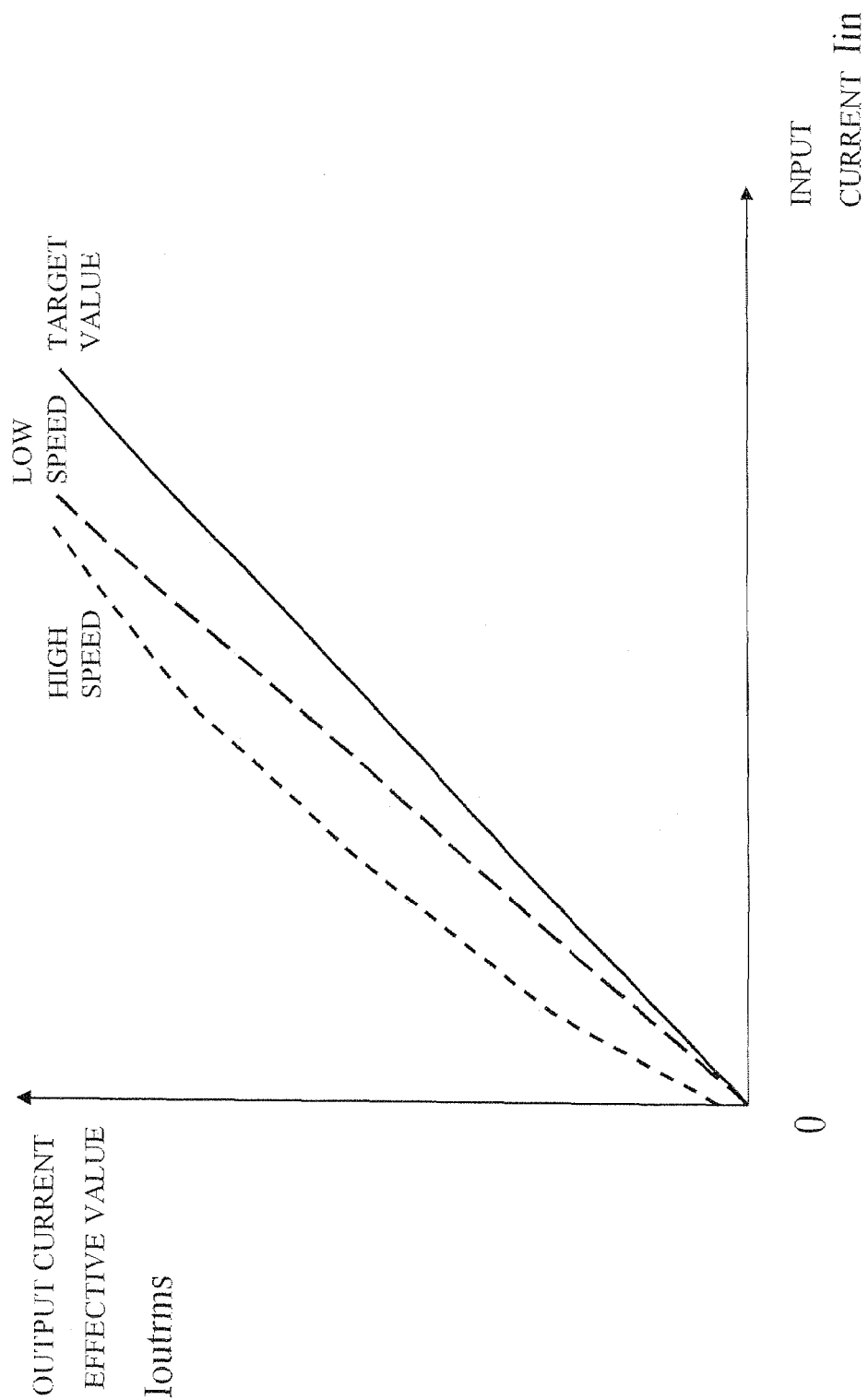
FIG. 36 is a characteristic diagram of the input current v.s. output current root-mean-square value for explaining the operation of the current source apparatus according to the third prior art.

Although the current mirror is comprised of p-channel MOS transistors in the embodiment, a current mirror comprised of n-channel MOS transistors may be used as shown in FIG. 27 (fourteenth embodiment). In this case, one of the current source apparatuses according to the second, fourth, sixth and eighth embodiments is used.

INDUSTRIAL APPLICABILITY

The current source apparatus according to the invention achieves a high-speed operation and an excellent linearity, and is therefore useful as a drive circuit or so.

What is claimed is:

1. A current source apparatus comprising:
a first MOS transistor having a drain serving as a current input terminal and a gate connected to said drain;
a second MOS transistor having a drain serving as a current output terminal;
a first switch having one end connected to a source of said second MOS transistor and another end connected to a supply voltage application terminal;
a second switch having one end connected to said gate of said first MOS transistor and another end connected to a gate of said second MOS transistor; and
a drive circuit which controls said first switch and said second switch, wherein:
a buffer is inserted in a path from said drain of said first MOS transistor to said gate thereof.

2. The current source apparatus according to claim 1, further comprising an emphasis circuit whose input is an output of said drive circuit and whose output is connected to said source of said second MOS transistor, and which emphasizes rising and falling of a drain current from said second MOS transistor.

3. The current source apparatus according to claim 1, wherein said buffer is a source follower circuit which has an input portion connected to said drain of said first MOS transistor, and an output portion connected to said gate of said first MOS transistor.

4. A current source apparatus comprising:
a first MOS transistor having a drain serving as a current input terminal and a gate connected to said drain;
a second MOS transistor having a drain serving as a current output terminal;
a first switch having one end connected to a source of said second MOS transistor and another end connected to a supply voltage application terminal;
a second switch having one end connected to said gate of said first MOS transistor and another end connected to a gate of said second MOS transistor;
a drive circuit which controls said first switch and said second switch; and
an emphasis circuit whose input is an output of said drive circuit and whose output is connected to said source of said second MOS transistor, and which emphasizes rising and falling of a drain current from said second MOS transistor.

5. The current source apparatus according to claim 4, wherein said emphasis circuit is comprised of an inverter logic circuit which inverts said output of said drive circuit, and a capacitor which extracts a high-frequency component from an output of said inverter logic circuit and applies said high-frequency component to said source of said second MOS transistor.

6. A light-emitting-device drive apparatus comprising:
a current source connected to a light emitting device;
a first current mirror input-side circuit and a second current mirror input-side circuit;
a first current mirror output-side circuit for current supply whose input is connected to an output portion of said first current mirror input side circuit and whose current output terminal is connected to a connecting point of said light emitting device and said current source; and
a second current mirror output side circuit for current pullout whose input portion is connected to an output portion of said second current mirror input side circuit and whose current output terminal is connected to the connecting point of said light emitting device and said current source,
said first and second current mirror input-side circuits each being comprised of a first MOS transistor having a drain serving as a current input terminal and a gate connected to said drain,
each of said first and second current mirror output-side circuits being comprised of a second MOS transistor having a drain serving as a current output terminal, a first switch having one end connected to a source of said second MOS transistor and another end connected to a supply voltage application terminal, a second switch having one end connected to said gate of said first MOS transistor and another end connected to a gate of said second MOS transistor, and a drive circuit which controls said first switch and said second switch.

7. The light-emitting-device drive apparatus according to claim 6, wherein said first switch is comprised of a third MOS transistor, said second switch is comprised of a fourth MOS transistor, and a fifth MOS transistor is connected to a source of said first MOS transistor.

8. The light-emitting-device drive apparatus according to claim 6, further comprising an emphasis circuit whose input is an output of said drive circuit and whose output is connected to said source of said second MOS transistor, and which emphasizes rising and falling of a drain current from said second MOS transistor.

9. The light-emitting-device drive apparatus according to claim 8, wherein said emphasis circuit is comprised of an inverter logic circuit which inverts said output of said drive circuit, and a capacitor which extracts a high-frequency component from an output of said inverter logic circuit and applies said high-frequency component to said source of said second MOS transistor.

10. The light-emitting-device drive apparatus according to claim 6, wherein a buffer is inserted in a path from said drain of said first MOS transistor to said gate thereof.

11. Light-emitting-device drive apparatus according to claim 10, further comprising an emphasis circuit whose input is an output of said drive circuit and whose output is connected to said source of said second MOS transistor, and which emphasizes rising and falling of a drain current from said second MOS transistor.

12. The light-emitting-device drive apparatus according to claim 10, wherein said buffer is a source follower circuit which has an input portion connected to said drain of said first MOS transistor, and an output portion connected to said gate of said first MOS transistor.

13. A digital-analog converting apparatus comprising:
a current mirror input-side circuit; and
a plurality of current mirror output-side circuits whose input portions are commonly connected to an output portion of said current mirror input side circuit and whose current output terminals are commonly connected,
said current mirror input-side circuit being comprised of a first MOS transistor having a drain serving as a current input terminal and a gate connected to said drain,
each of said plurality of current mirror output-side circuits being comprised of a second MOS transistor having a drain serving as a current output terminal, a first switch having one end connected to a source of said second MOS transistor and another end connected to a supply voltage application terminal, a second switch having one end connected to said gate of said first MOS transistor and another end connected to a gate of said second MOS transistor, and a drive circuit which controls said first switch and said second switch, said plurality of current mirror output-side circuits being separated into groups of a number corresponding to a weight of each bit of an input digital value of a plurality of bits to be converted, whereby
said first and second switches of said drive circuits of each group of current mirror output side circuits are controlled according to data of the associated bit in said input digital value, so that a current corresponding to said input digital value is output as a combined output current of said plurality of current mirror output side circuits.

14. The digital-analog converting apparatus according to claim 13, wherein said first switch is comprised of a third MOS transistor, said second switch is comprised of a fourth MOS transistor, and a fifth MOS transistor is connected to a source of said first MOS transistor.

15. The digital-analog converting apparatus according to claim 13, wherein the size ratio of the output-side transistor of the current mirror is changed with respect to the input-side transistor of the current mirror in accordance with the bit weight.

16. The digital-analog converting apparatus according to claim 13, further comprising an emphasis circuit whose input is an output of said drive circuit and whose output is connected to said source of said second MOS transistor, and which emphasizes rising and falling of a drain current from said second MOS transistor.

17. The digital-analog converting apparatus according to claim 16, wherein said emphasis circuit is comprised of an inverter logic circuit which inverts said output of said drive circuit, and a capacitor which extracts a high-frequency component from an output of said inverter logic circuit and applies said high frequency component to said source of said second MOS transistor.

18. The digital-analog converting apparatus according to claim 13, wherein a buffer is inserted in a path from said drain of said first MOS transistor to said gate thereof.

19. The digital-analog converting apparatus according to claim 18, further comprising an emphasis circuit whose input is an output of said drive circuit and whose output is connected to said source of said second MOS transistor, and which emphasizes rising and falling of a drain current from said second MOS transistor.

20. The digital-analog converting apparatus according to claim 18, wherein said buffer is a source follower circuit which has an input portion connected to said drain of said first MOS transistor, and an output portion connected to said gate of said first MOS transistor.

21. A light-emitting-device drive apparatus comprising:
a current mirror input side circuit; and
a plurality of current mirror output side circuits whose input portions are commonly connected to an output portion of said current mirror input side circuit and whose current output terminals are commonly connected to a light emitting device,
said current mirror input side circuit being comprised of a first MOS transistor having a drain serving as a current input terminal and a gate connected to said drain,
each of said plurality of current mirror output-side circuits being comprised of a second MOS transistor having a drain serving as a current output terminal, a first switch having one end connected to a source of said second MOS transistor and another end connected to a supply voltage application terminal, a second switch having one end connected to said gate of said first MOS transistor and another end connected to a gate of said second MOS transistor, and a drive circuit which controls said first switch and said second switch, wherein:
a buffer is inserted in a path from said drain of said first MOS transistor to said gate thereof.

22. The light-emitting-device drive apparatus according to claim 21, further comprising an emphasis circuit whose input is an output of said drive circuit and whose output is connected to said source of said second MOS transistor, and which emphasizes rising and falling of a drain current from said second MOS transistor.

23. The light-emitting-device drive apparatus according to claim 21, wherein said buffer is a source follower circuit which has an input portion connected to said drain of said first MOS transistor, and an output portion connected to said gate of said first MOS transistor.

24. A light-emitting-device drive apparatus comprising:
a current mirror input-side circuit;
a plurality of current mirror output side circuits whose input portions are commonly connected to an output portion of said current mirror input-side circuit and whose current output terminals are commonly connected to a light emitting device; and
an emphasis circuit whose input is an output of said drive circuit and whose output is connected to said source of said second MOS transistor, and which emphasizes rising and falling of a drain current from said second MOS transistor,
said current mirror input-side circuit being comprised of a first MOS transistor having a drain serving as a current input terminal and a gate connected to said drain, and
each of said plurality of current mirror output-side circuits being comprised of a second MOS transistor having a drain serving as a current output terminal, a first switch having one end connected to a source of said second MOS transistor and another end connected to a supply voltage application terminal, a second switch having one end connected to said gate of said first MOS transistor and another end connected to a gate of said second MOS transistor, and a drive circuit which controls said first switch and said second switch.

25. The light-emitting-device drive apparatus according to claim 24, wherein said emphasis circuit is comprised of an inverter logic circuit which inverts said output of said drive circuit, and a capacitor which extracts a high-frequency component from an output of said inverter logic circuit and applies said high-frequency component to said source of said second MOS transistor.

* * * * *